US006608320B1

(12) United States Patent
Skunes et al.

(10) Patent No.: US 6,608,320 B1
(45) Date of Patent: Aug. 19, 2003

(54) ELECTRONICS ASSEMBLY APPARATUS WITH HEIGHT SENSING SENSOR

(75) Inventors: Timothy A. Skunes, Mahtomedi, MN (US); Steven K. Case, St. Louis Park, MN (US)

(73) Assignee: CyberOptics Corporation, Golden Valley, MN (US)

( * ) Notice: Subject to any disclaimer, the term of this patent is extended or adjusted under 35 U.S.C. 154(b) by 0 days.

(21) Appl. No.: 09/434,320

(22) Filed: Nov. 4, 1999

Related U.S. Application Data

(60) Provisional application No. 60/107,188, filed on Nov. 5, 1998, provisional application No. 60/107,505, filed on Nov. 6, 1998, provisional application No. 60/131,996, filed on Apr. 30, 1999, provisional application No. 60/144,616, filed on Jul. 20, 1999, and provisional application No. 60/144,614, filed on Jul. 20, 1999.

(51) Int. Cl.[7] ............................................. G01B 11/24
(52) U.S. Cl. ............................ 250/559.19; 250/559.22; 356/625; 348/133
(58) Field of Search ........................ 250/223 R, 559.19, 250/559.22, 559.26, 559.27, 559.4; 356/614, 625, 628, 629, 630; 382/154; 348/133, 134

(56) References Cited

U.S. PATENT DOCUMENTS

| | | | |
|---|---|---|---|
| 4,473,842 A | 9/1984 | Suzuki et al. | 358/107 |
| 4,521,112 A | 6/1985 | Kuwabara et al. | 356/375 |
| 4,578,810 A | 3/1986 | MacFarlane et al. | 382/8 |
| 4,615,093 A | 10/1986 | Tews et al. | 29/407 |
| 4,675,993 A | 6/1987 | Harada | 29/740 |
| 4,700,398 A | 10/1987 | Mizuno et al. | 382/1 |
| 4,706,379 A | 11/1987 | Seno et al. | 29/740 |
| 4,727,471 A | 2/1988 | Driels et al. | 364/167 |
| 4,738,025 A | 4/1988 | Arnold | 29/834 |
| 4,743,768 A | 5/1988 | Watannabe | 250/556 |
| 4,772,125 A | 9/1988 | Yoshimura et al. | 356/237 |
| 4,782,273 A | 11/1988 | Moynagh | 318/568 |
| 4,794,689 A | 1/1989 | Seno et al. | 29/740 |
| 4,811,410 A | 3/1989 | Amir et al. | 382/8 |
| 4,875,778 A | 10/1989 | Luebbe et al. | 356/394 |

(List continued on next page.)

FOREIGN PATENT DOCUMENTS

| | | |
|---|---|---|
| DE | 198 26 555 A1 | 12/1999 |
| EP | 0 664 666 A1 | 1/1994 |
| EP | 0 942 641 A2 | 9/1997 |
| EP | 0 854 671 A1 | 7/1998 |
| EP | 0 730 397 B1 | 4/1999 |
| JP | 2-18900 | 7/1990 |
| JP | 2-275700 | 11/1990 |
| JP | 2-306700 | 12/1990 |
| JP | 3-030499 | 2/1991 |

(List continued on next page.)

OTHER PUBLICATIONS

Copy of International Search Report from Application No. PCT/US01/11629 with International filing date of Apr. 4, 2001.

Copy of International Search Report from Application No. PCT/US01/07810 with international filing date of Mar. 13, 2001.

(List continued on next page.)

Primary Examiner—Stephone B. Allen
(74) Attorney, Agent, or Firm—Westman, Champlin & Kelly, P.A.

(57) ABSTRACT

A pick and place machine, and its imaging system are disclosed. The imaging system is movable with a head of the pick and place machine and includes a linear detector which is adapted to move proximate the component to thereby scan the component. The imaging system provides an indication of feature height on a component held by the pick and place machine. The height is based upon the intensity of a plurality of focused images. A method for sensing feature height of an object on a component as well as the coplanarity of objects held by a pick and place machine is also provided.

33 Claims, 18 Drawing Sheets

U.S. PATENT DOCUMENTS

| | | | |
|---|---|---|---|
| 4,876,728 A | 10/1989 | Roth | 382/21 |
| 4,920,429 A | 4/1990 | Jaffe et al. | 358/471 |
| 4,942,618 A | 7/1990 | Sumi et al. | 382/8 |
| 4,959,898 A | 10/1990 | Landman et al. | 29/705 |
| 4,969,108 A | 11/1990 | Webb et al. | 364/513 |
| 4,973,216 A | 11/1990 | Domm | 414/744.5 |
| 4,980,971 A | 1/1991 | Bartschat et al. | 29/833 |
| 5,030,008 A | 7/1991 | Scott et al. | 356/394 |
| 5,046,113 A | 9/1991 | Hoki | 382/8 |
| 5,084,959 A | 2/1992 | Ando et al. | 29/740 |
| 5,084,962 A | 2/1992 | Takahashi et al. | 29/833 |
| 5,086,559 A | 2/1992 | Akatsuchi | 29/834 |
| 5,096,353 A | 3/1992 | Tesh et al. | 414/225 |
| 5,099,522 A | 3/1992 | Morimoto | 382/8 |
| 5,140,643 A | 8/1992 | Izumi et al. | 382/8 |
| 5,148,591 A | 9/1992 | Pryor | 29/407 |
| 5,195,234 A | 3/1993 | Pine et al. | 29/720 |
| 5,208,463 A | 5/1993 | Honma et al. | 250/561 |
| 5,233,745 A | 8/1993 | Morita | 29/705 |
| 5,237,622 A | 8/1993 | Howell | 382/8 |
| 5,249,239 A | 9/1993 | Kida | 382/8 |
| 5,249,349 A | 10/1993 | Kuinose et al. | 29/721 |
| 5,278,634 A | 1/1994 | Skunes et al. | 356/375 |
| 5,309,522 A | 5/1994 | Dye | 382/41 |
| 5,342,460 A | 8/1994 | Hidese | 156/64 |
| 5,369,492 A | 11/1994 | Sugawara | 356/394 |
| 5,377,405 A | 1/1995 | Sakurai et al. | 29/833 |
| 5,379,514 A | 1/1995 | Okuda et al. | 29/833 |
| 5,383,270 A | 1/1995 | Iwatsuka et al. | 29/840 |
| 5,403,140 A | 4/1995 | Carmichael et al. | 414/280 |
| 5,434,629 A | 7/1995 | Pearson et al. | 348/721 |
| 5,452,370 A | 9/1995 | Nagata | 382/153 |
| 5,456,003 A | 10/1995 | Yamamoto et al. | 29/840 |
| 5,461,480 A | 10/1995 | Yamada et al. | 356/394 |
| 5,491,888 A | 2/1996 | Sakurai et al. | 29/832 |
| 5,523,663 A | 6/1996 | Tsuge et al. | 318/568.16 |
| 5,541,834 A | 7/1996 | Tomigashi et al. | 364/167.01 |
| 5,555,090 A | 9/1996 | Schmutz | 356/381 |
| 5,559,727 A | 9/1996 | Deley et al. | 364/559 |
| 5,560,100 A | 10/1996 | Englert | 29/833 |
| 5,566,447 A | 10/1996 | Sakurai | 295/832 |
| 5,592,563 A | 1/1997 | Zahavi | 382/154 |
| 5,608,642 A | 3/1997 | Onodera | 364/478.01 |
| 5,619,328 A | 4/1997 | Sakurai | 356/375 |
| 5,660,519 A | 8/1997 | Ohta et al. | 414/783 |
| 5,661,561 A | 8/1997 | Wurz et al. | 356/386 |
| 5,671,527 A | 9/1997 | Asai et al. | 29/740 |
| 5,694,219 A | 12/1997 | Kim | 356/375 |
| 5,724,722 A | 3/1998 | Hashimoto | 29/740 |
| 5,743,005 A | 4/1998 | Nakao et al. | 29/833 |
| 5,768,759 A | 6/1998 | Hudson | 29/407.04 |
| 5,777,746 A | 7/1998 | Dlugos | 356/380 |
| 5,787,577 A | 8/1998 | Kent | 29/833 |
| 5,832,107 A | 11/1998 | Choate | 382/154 |
| 5,839,186 A | 11/1998 | Onodera | 29/720 |
| 5,855,059 A | 1/1999 | Togami et al. | 29/740 |
| 5,864,944 A | 2/1999 | Kashiwagi et al. | 29/833 |
| 5,878,484 A | 3/1999 | Araya et al. | 29/740 |
| 5,999,266 A | 12/1999 | Takahashi et al. | 356/376 |
| 5,999,640 A | 12/1999 | Hatase et al. | 382/151 |
| 6,018,865 A | 2/2000 | Michael | 29/740 |
| 6,031,242 A | 2/2000 | Hudson | 250/548 |
| 6,118,538 A | 9/2000 | Haugan et al. | 356/375 |
| 6,195,165 B1 | 2/2001 | Sayegh | 356/376 |
| 6,232,724 B1 | 5/2001 | Onimoto et al. | 315/161 |
| 6,243,164 B1 | 6/2001 | Baldwin et al. | 356/375 |
| 6,291,816 B1 | 9/2001 | Liu | 250/234 |
| 6,342,916 B1 | 1/2002 | Kashiwagi et al. | 348/87 |

FOREIGN PATENT DOCUMENTS

| | | |
|---|---|---|
| JP | 3-110898 | 5/1991 |
| JP | 3-265198 | 11/1991 |
| JP | 3-117898 | 12/1991 |
| JP | 3-289197 | 12/1991 |
| JP | 3-293800 | 12/1991 |
| JP | 3-104300 | 2/1992 |
| JP | 4-051598 | 2/1992 |
| JP | 4-064292 | 2/1992 |
| JP | 4-083400 | 3/1992 |
| JP | 4-107988 | 4/1992 |
| JP | 4-107993 | 4/1992 |
| JP | 4-262201 | 9/1992 |
| JP | 4-271200 | 9/1992 |
| JP | 4-311100 | 11/1992 |
| JP | 5-053360 | 7/1993 |
| JP | 5-335793 | 12/1993 |
| JP | 7-020960 | 8/1994 |
| JP | 6-291490 | 10/1994 |
| JP | 6-310899 | 11/1994 |
| JP | 7-336099 | 12/1995 |
| JP | 8-005335 | 1/1996 |
| JP | 8-018289 | 1/1996 |
| JP | 8-032299 | 2/1996 |
| JP | 8-043025 | 2/1996 |
| JP | 8-046396 | 2/1996 |
| JP | 8-167799 | 6/1996 |
| JP | 2554424 | 8/1996 |
| JP | 2554437 | 8/1996 |
| JP | 9-023097 | 1/1997 |
| JP | 9-246799 | 9/1997 |
| JP | 9-293998 | 11/1997 |
| JP | 9-307286 | 11/1997 |
| JP | 9-307297 | 11/1997 |
| JP | 2847801 B2 | 1/1999 |
| JP | 2000-312100 | 7/2000 |
| JP | 2000-299600 | 10/2000 |
| JP | P3186387 | 7/2001 |
| WO | WO 99/42257 | 8/1999 |
| WO | WO 00/26611 | 5/2000 |

OTHER PUBLICATIONS

"Library of C/C++ Machine Vision Software Routines" *Imaging Technology*, pp. 63–68 (1999).

"A New Sense for Depth of Field," by A. Pentland, IEEE Trans. Pattern Anal. Machine Intell. 9, pp. 523–531 (1987).

"A Matrix Based Method for Determining Depth From Focus," by J. Ens and P. Lawrence, in Proceedings of IEEE Conference on Computer Vision and Pattern Recognition (Institute of Electrical and Electronics Engineers, New Your, pp. 600–609 (1991).

"A Perspective on Range Finding Technique for Compute Vision," by R.A. Jarvis, IEEE Trans. Pattern Anal. Machine Intell. 5, pp. 122–139 (1983).

"Pyramid Based Depth from Focus," by T. Darrel and K. Wohn, in Proceedings of IEEE Conference on Computer Vision and Pattern Recognition (Institute of Electrical and Electronics Engineers, New York), pp. 504–509 (1988).

"Real Time Computation of Depth from Defocus", by Watanabe et al., *SPIE*, vol. 2599, pp. 14–25 (1996).

"Root–Mean Square Error in Passive Autofocusing and 3D Shape Recovery", by Subbarao et al., *SPIE*, vol. 2909, pp. 162–177 (1997).

"A Stereo Imaging System for Dimensional Measurement", by Robert C. Chang, SPIE, vol. 2909, pp. 50–57 (1997).

"Application of Modulation Measurement Profilometry to Objects with Surface Holes", by Likun et al., *Applied Optics*, vol. 38, No. 7, pp. 1153–1158 (Mar. 1999).

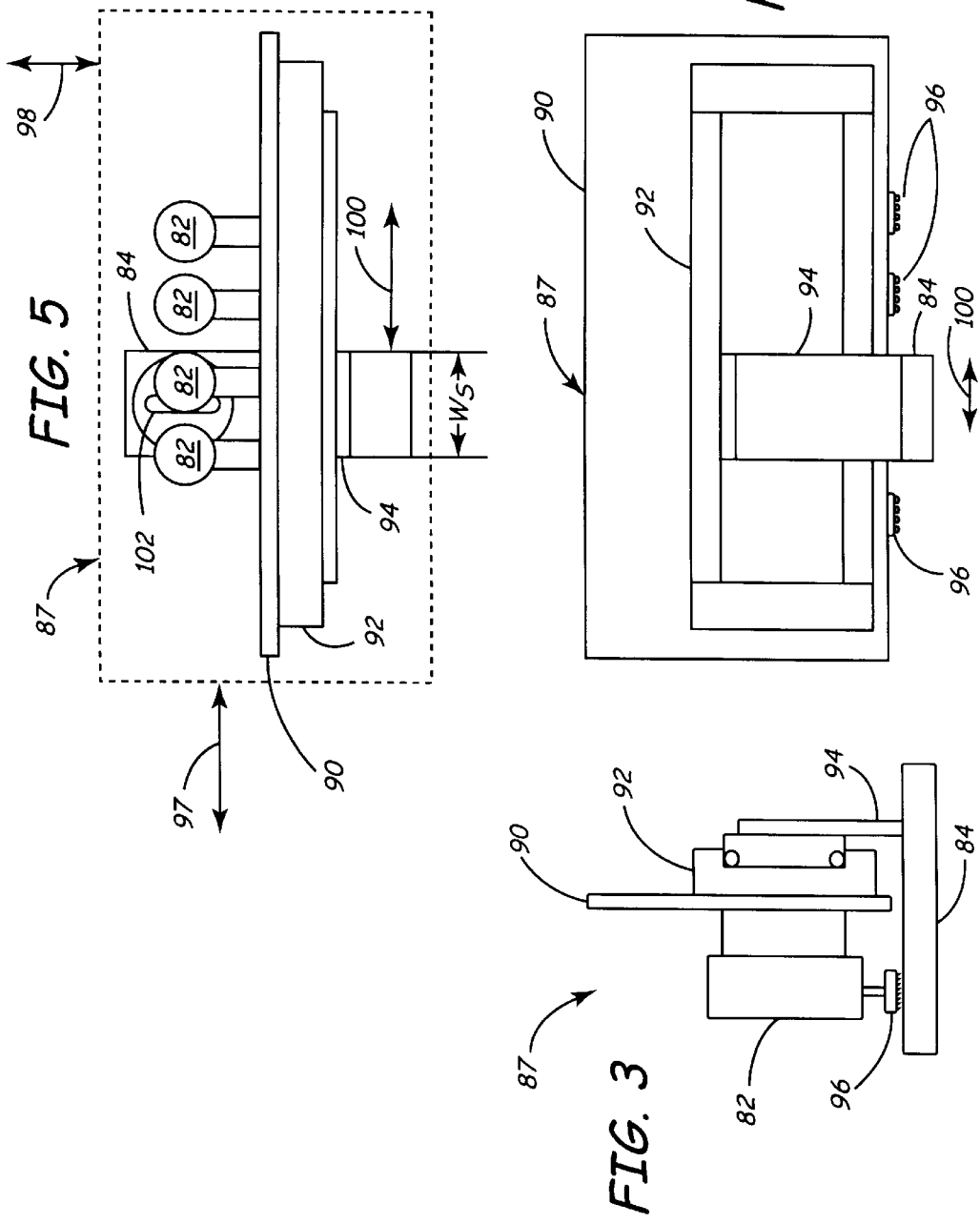

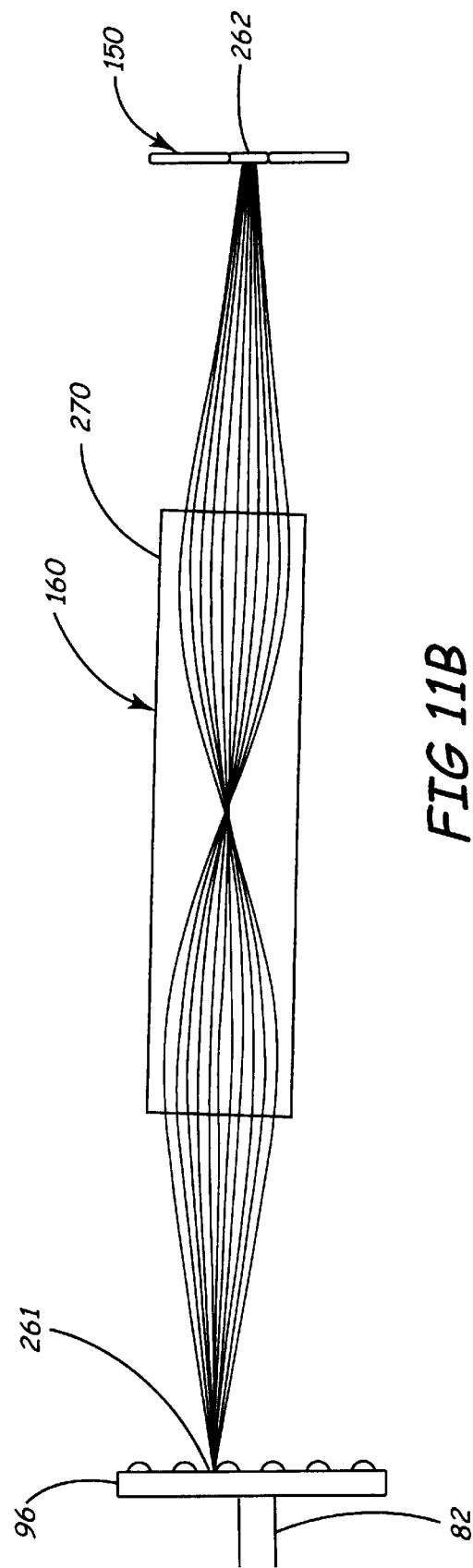

ELECTRONICS ASSEMBLY APPARATUS WITH HEIGHT SENSING SENSOR

CROSS-REFERENCE TO RELATED APPLICATIONS

This application claims the priority of earlier filed co-pending Provisional Applications; serial No. 60/107,188, filed Nov. 5, 1998, entitled COMPACT SCANNING CAMERA; serial No. 60/107,505 filed Nov. 6, 1998, entitled COMPACT SCANNING CAMERA; serial No. 60/131,996, filed Apr. 30, 1999, entitled COMPACT LINE SCAN CAMERA WITH IMPROVED THROUGHPUT; serial No. 60/144,616, filed Jul. 20, 1999, entitled SINGLE PATH LINESCAN CAMERA FOR SENSING HEIGHT THROUGH DEFOCUSING; and serial No. 60/144,614, filed Jul. 20, 1999, entitled STEREO VISION LINESCAN CAMERA WITH COPLANARITY AND RELATED APPLICATIONS THEREOF. Each and every provisional application listed above is incorporated by reference herein in its entirety.

COPYRIGHT RESERVATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF INVENTION

The present invention relates to imaging systems for electronic components, such as those used in pick and place machines, and more particularly to imaging systems which image a portion of a component onto a linear detector line by line, and are able to provide information about the height of a feature on the component.

BACKGROUND OF THE INVENTION

Prior art systems for detecting height and coplanarity are typically either vision based or premised on the use of a large array, fixed format detector. In general, these enhanced systems can be divided into two separate groups; those which are based on a linear detector and those which are not (e.g., vision based and large array detectors systems). Vision based and large array detector systems are typically not "on-head" systems. In on-head sensing systems, a sensor senses the orientation and condition (e.g., coplanar, absence/presence of features, etc.) of the component while the component is transported to the printed circuit board. On-head systems are preferred over other systems because they provide exceptional efficiency in placing the component, leading to a high throughput in the electronic assembly operation. On the other hand, off-head systems have a sensor which senses the orientation and condition of a component while the component is stationary with respect to the printed circuit board. Vision based and large array detector systems have a fairly large weight and size, so as to limit the scanning speed for the sensor in an "on-head" application.

Linescan sensor systems are characterized by having a linear detector and are adapted to scan a portion of a component. Associated electronics assemble multiple scans of a portion of a component and provide a composite image of the area of interest on a component. However, existing linescan systems are typically off-head which slows down the process of placing the component. Furthermore, many are based on the principle of triangulation (the use of structured light to compute a height), which requires complex optics and registration in the sensor.

The prior art lacks a versatile, compact linescan sensor system reporting coplanarity, component quality and orientation of the object, which system is adapted for use either in "on-head" or "off-head" applications. The ideal system would allow for inspection of features on different types of complex components at high throughput, and be easily adapted for use with pick and place machines, wire bonders and screen printers.

SUMMARY OF THE INVENTION

The present invention is a linescan sensor which collects a first assembled image of the component while the component is a first distance away from a first line focus, and then collects a second assembled image of the component at a second distance away from a second line focus. In embodiment A, a sensor alternatively energizes the first line foci and then the second line foci, while a linear detector in the sensor provides a partial image of the same portion of the component resulting from each line foci. In embodiment B, a sensor energizes a single line focus and the sensor scans the component once at a first distance from the component and then at a second distance from the component, a linear detector in the sensor providing partial images of the component during each of the two scans. With each method, the two resulting sets of partial images are assembled into two composite images from which associated electronics compute the height of a feature on the component, such as a ball, lead, column or grid on the scanned surface of the component. Once the height of at least four features on the component is computed, a measure of the coplanarity of the component may be computed. Additionally, the height information from the present invention may be used to assess the quality of a component, such as ascertaining the absence or presence of critical features on the component as a measure of the component quality.

An additional optical path in each embodiment may be present and used with a variety of different types of illumination, so as to optionally provide two dimensional location information. In such case, the partial image resulting from the additional optical path is interleaved with the partial images of either method so as to form a third assembled image of at least a portion of the component.

The method and apparatus of the present invention is useful for both single and multi-nozzle pick and place machines, but may also be used with screen printers to assess whether applied solder bricks are present or absent, or to assess whether the height of the solder bricks is appropriate. Optionally, the method and apparatus of the present invention is useful with wire bonders, to ascertain the height of a bonded wire or the like as a measure of the quality of the bonding process.

BRIEF DESCRIPTION OF THE DRAWINGS

FIG. 3 is a side elevation view of a portion of a placement head in accordance with an embodiment of the present invention.

FIGS. 4–6 are rear elevation and two top plan views of a portion of a placement head in accordance with an embodiment of the present invention.

FIGS. 11a and 11b are perspective and side elevation views of a gradient index lens array imaging system.

DETAILED DESCRIPTION OF THE PREFERRED EMBODIMENTS

The method and apparatus of the present invention is best understood by first disclosing a preferred linescan sensor for use with the present invention. After a complete discussion of the preferred embodiments of this preferred linescan sensor, the theory and embodiments of the present height sensing linescan sensor will be detailed. It is understood that the method of the present invention may be practiced with other types of linescan sensors or any sensor having a linear detector which builds up an image of an object line by line.

Figure 1:
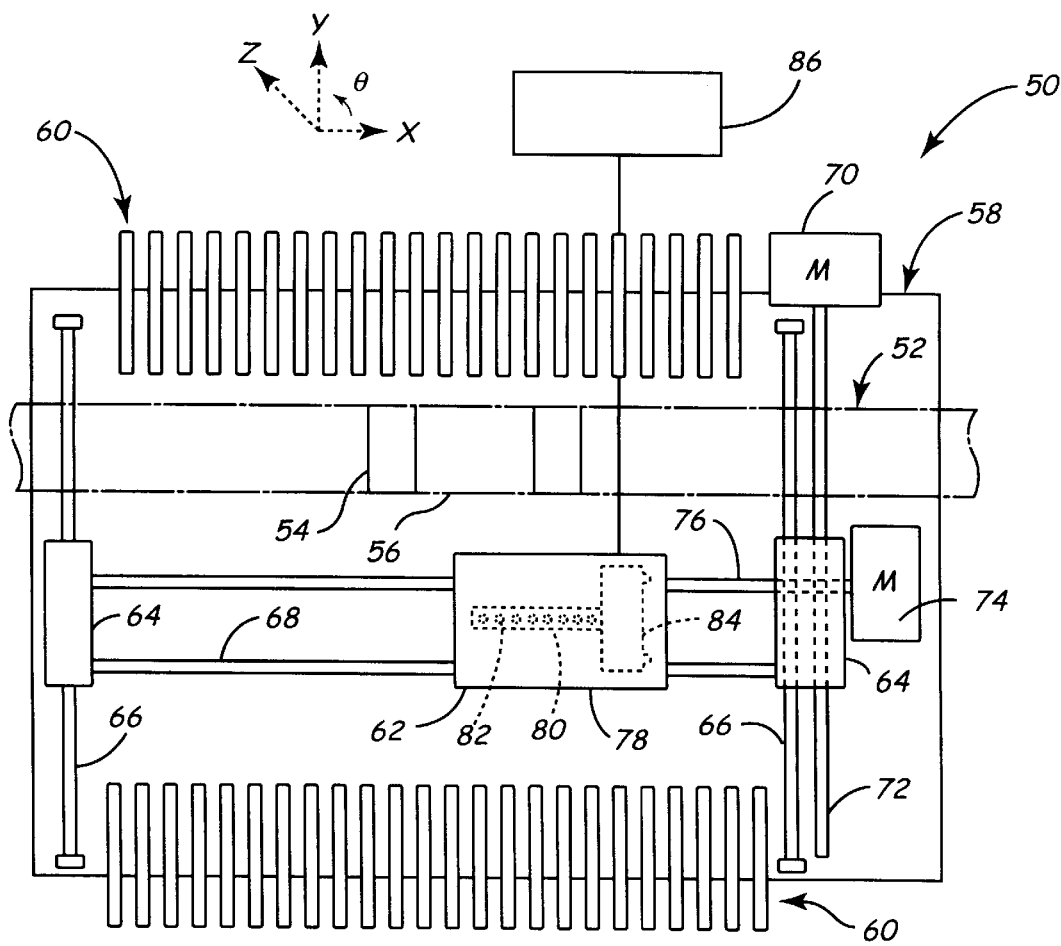
FIG. 1 is a top plan view of a pick and place machine.

FIG. 1 is a top plan view of pick and place machine 50 in accordance with an embodiment of the invention. Although much of the present invention will be described with respect to pick and place machine 50, other forms of pick and place machines, such as a split gantry design, are useful with embodiments of the present invention. Additionally, although embodiments of the present invention will be described with respect to pick and place machines, some embodiments of the present invention include an imaging system provided with a wire bonder or screen printer, as will be described with respect to FIGS. 19 and 21. As shown in FIG. 1, machine 50 includes transport mechanism 52 that is adapted to transport a workpiece such as a printed circuit board. Transport mechanism 52 includes mounting section 54 and conveyor 56. Transport mechanism 52 is disposed on base 58 such that a workpiece is carried to mounting section 54 by conveyor 56. Component reservoirs 60 are disposed on either side of transport mechanism 52 and supply electronic components. Reservoirs 60 can be any suitable device adapted to provide electronic components, such as a tape feeder.

Pick and place machine 50 includes head 62 disposed above base 58. Head 62 is movable between either of component reservoirs 60 and mounting section 54. As can be seen, head supports 64 are movable on rails 66 thereby allowing head 62 to move in the Y direction over base 58. Movement of head 62 in the Y direction occurs when motor 70, in response to a motor actuation signal, rotates ball screw 72 which engages one of head supports 64 to thereby displace the support 64 is the Y direction.

Head 62 is also supported upon rail 68 to allow head movement in the X direction relative to base 58. Movement of head 62 in the X direction occurs when motor 74, in response to a motor actuation signal, rotates ball screw 76 which engages head 62 and displaces head 62 in the X direction.

As can also be seen, head 62 includes body 78, nozzle mount 80, nozzles 82 and sensor 84. Nozzle mount 80 is disposed within body 78 and mounts each of nozzles 82 within body 78. Each of nozzles 82 is movable in the Z direction (up/down) and is rotatable about the Z axis by suitable actuation members, such as servo motors. Sensor 84 is adapted to move in the X direction relative to nozzles 82 to acquire images of components held by nozzles 82. Sensor 84 is coupled to image processor 86. Image processor 86 receives video data from sensor 84 based upon images of components held by nozzles 82. Image processor 86 is adapted through hardware, software, or a combination of both, to calculate respective component orientations of each of the components held by the respective nozzles 82. Image processor 86 then sends suitable orientation information to a controller (not shown) such that each of nozzles 82 is successively displaced to properly mount its respective component upon the workpiece. Although FIG. 1 shows a number of nozzles 82, it is expressly contemplated that pick and place machine 50 can include a singular nozzle to practice embodiments of the present invention.

Figure 2:
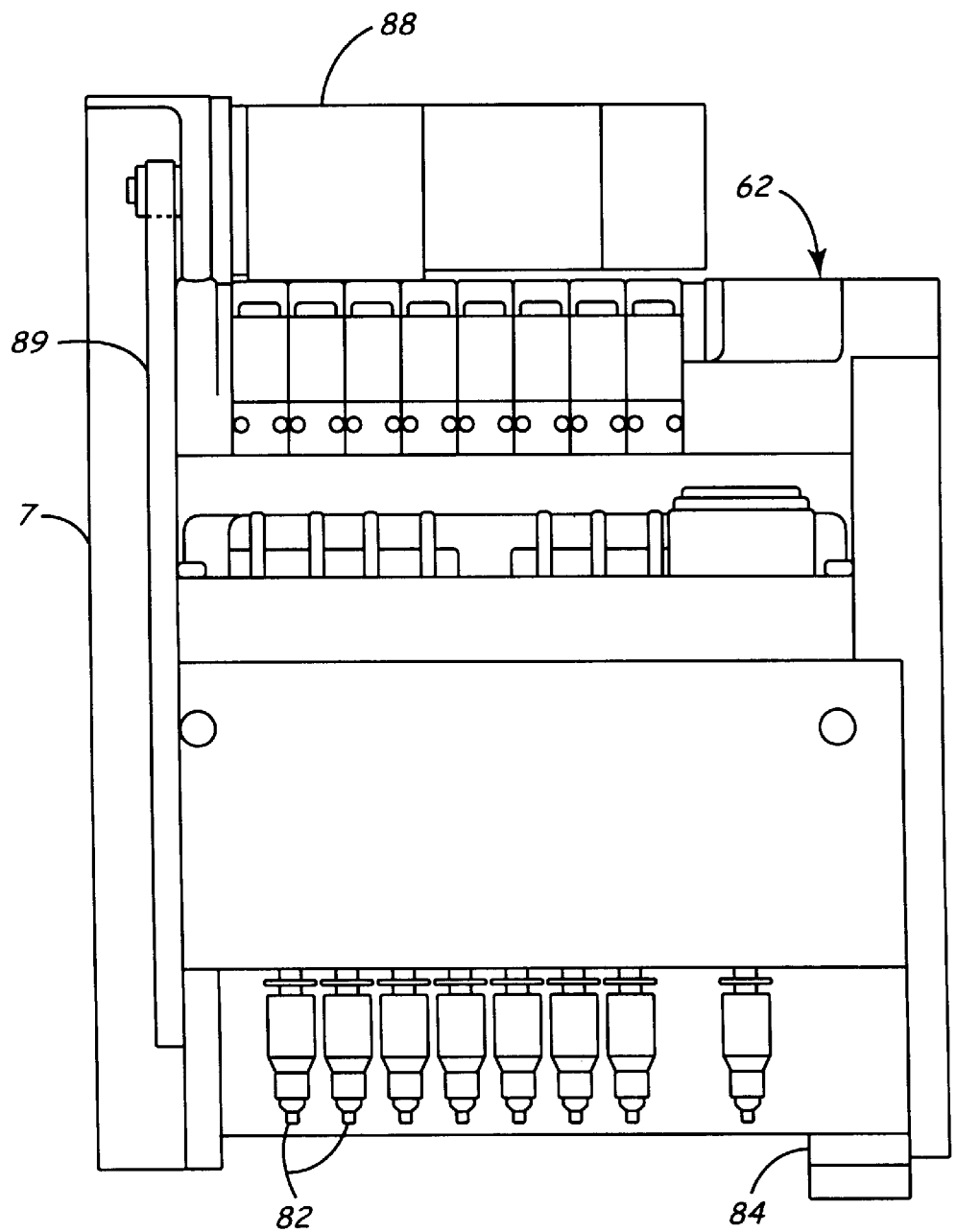
FIG. 2 is an elevation view of a placement head in accordance with an embodiment of the present invention.

FIG. 2 is an elevation view of head 62 in accordance with one embodiment of the present invention. Head 62 includes motor 88 operably coupled to a ball screw (not shown) through belt 89. The ball screw is operably coupled to sensor 84 such that energization of motor 88 causes sensor 84 to move in the X axis direction relative to nozzles 82. Sensor 84 can be adapted to image components coupled to nozzles 82 while scanning in either X axis direction. When such bi-directional scanning is employed, it is useful to provide image processing software that corrects for the fact that the data from scans of opposite directions are essentially flipped around from one another. Additionally, in some bi-directional scanning embodiments, sensor 84 can store the various scanned lines in temporary memory and then send them to the image processing section in correct order.

FIG. 3 is an elevation view of head 87 in accordance with an embodiment of the invention. Head 87 includes plate 90 to which nozzles 82 and linear stage 92 are mounted. Sensor 84 is coupled to linear stage 92 via bracket 94 such that sensor 84 is moveable relative to nozzles 82 and thus component 96. As can be seen in FIG. 4 at arrow 100, sensor 84 is moveable in the X axis direction relative to components 96.

FIG. 5 is a top plan view of head 87 in accordance with an embodiment of the present invention. For clarity, only four nozzles 82 are shown in FIG. 5. However, any appropriate number of nozzles, including one nozzle, can be used. As indicated by arrows 97 and 98, head 87 is movable in X and Y axis directions, respectively. As indicated by arrow 100, sensor 84 is movable in the X axis direction with respect to nozzles 82 via its coupling to linear stage 92. Sensor 84 includes detector window 102 which allows a line of sight between a linear detector (not shown) disposed within sensor 84 and a portion of a component held by one of nozzles 82. The line of sight is preferably parallel to the axis of nozzles 82. Each of nozzles 82 within the pick and place machine can be adapted to pick and place a different type of electrical component. Examples of such different component types include flip-chips, ball grid arrays (BGA's), micro ball grid arrays, quad flat pack (QFP), connector, pin grid array, dual inline package, single inline package, plastic leaded chip carrier (PLCC), chip capacitors, and chip resistors. Moreover, each nozzle 82 can be independently adapted to pick and place a different type of component than other nozzles 82. Because different component types can require different image resolutions, embodiments of the present invention can preferably change image resolution based upon component type.

Figure 6:
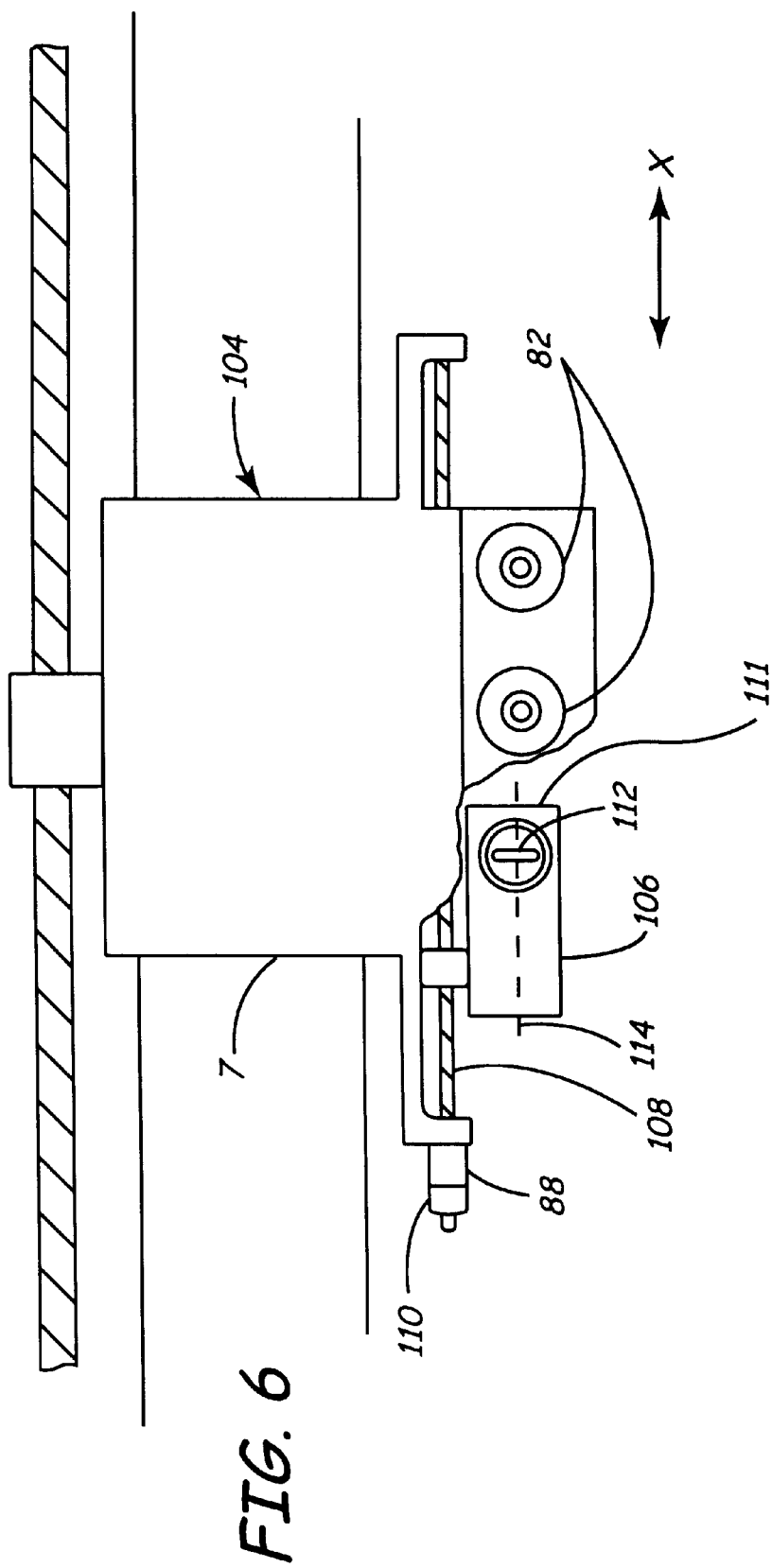

FIG. 6 is a top plan view of placement head 104 for a pick and place machine in accordance with another embodiment of the present invention. Head 104 bears many similarities to head 87, and like components are numbered similarly. As can be seen, head 104 includes body 7 and one or more nozzles 82. Sensor 106 is moveable relative to nozzles 82 since sensor 106 is coupled to motor 88 via ball screw 108. Motor 88 also includes encoder 110 that provides a feedback signal indicative of rotational displacement of ball screw 108 and thus axial displacement of sensor 106 in the X direction. In contrast to sensor 84 shown in FIG. 5, sensor 106 includes a detector window 112 that is perpendicular to a longitudinal axis 114 of sensor 106. Detector window 112 can be positioned anywhere on sensor 106. Thus, if sensor 106 is adapted to scan components in a single direction (for example while moving to the right) then window 112 can be disposed proximate a leading edge 111 of sensor 106 such that components are scanned more quickly. In embodiments where sensor 106 is adapted to scan components in either direction (left and right) window 112 is preferably centered upon sensor 106.

Figure 7:
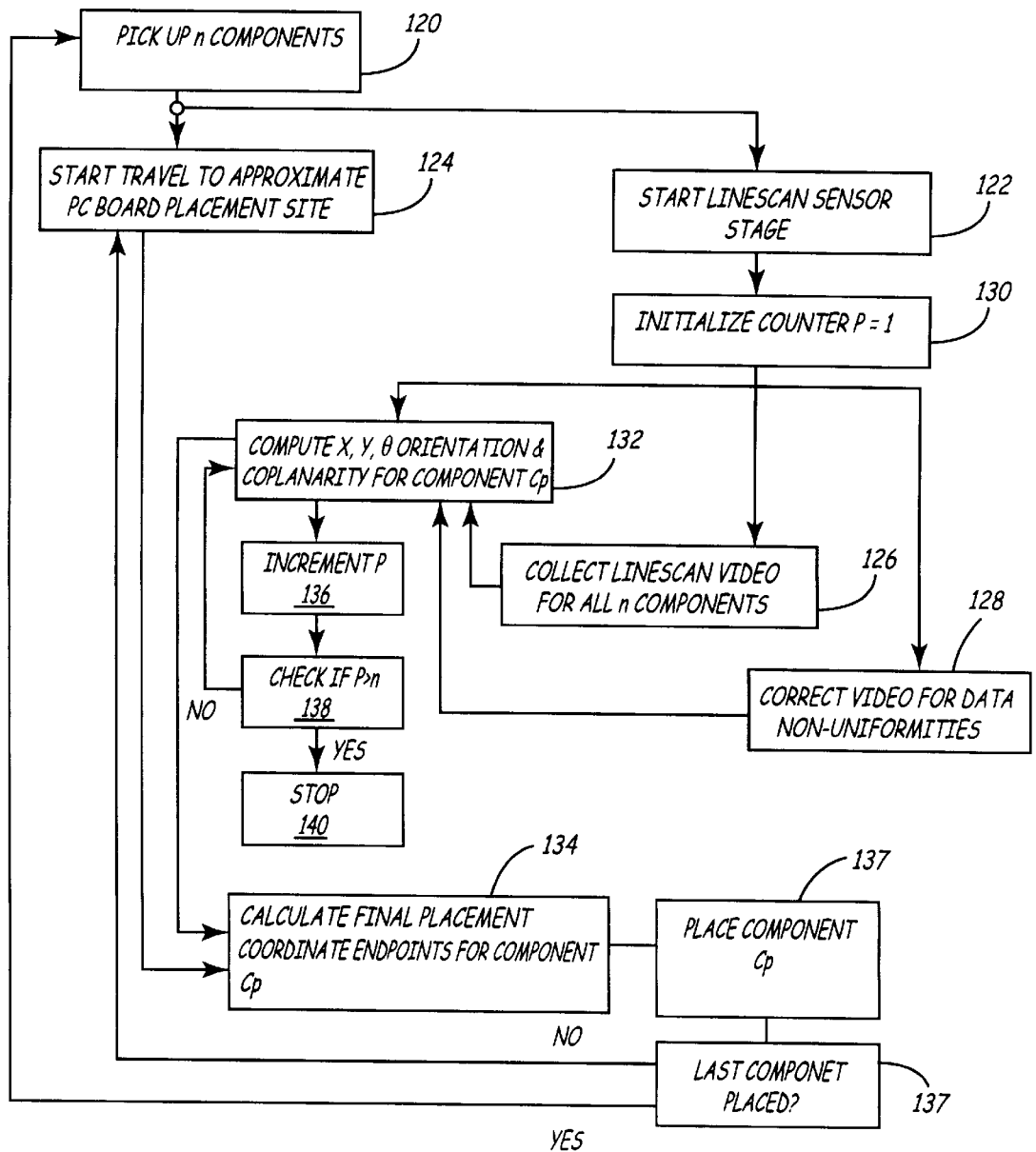
FIG. 7 is a flowchart of a method of picking and placing components in accordance with an embodiment of the present invention.

FIG. 7 is a flowchart of a method of picking and placing n components upon a workpiece in accordance with the present invention. Throughout this document, sequential operations for practicing s the method of the present invention are disclosed. It is understood that for any successive sequential operations, that the first operation need only be commenced before the second operation is started. For example, once block 120 is commenced, the operation of picking the component up need not be fully completed before the operation of block 124 is started. At block 120, n components are picked up by a pick and place machine head, such as head 87. Subsequently, blocks 122 and 124 are initiated. Thus, a linescan camera begins moving relative to the components as indicated by block 122 and the head begins traveling to the approximate position or site on the workpiece where the first component will be mounted. Preferably, blocks 122 and 124 are executed substantially simultaneously.

At block 130, a counter (P) is initialized to equal 1. Counter P is used to track which component coordinates are being computed, as will be described in greater detail with respect to the rest of FIG. 7. After block 130, blocks 126, 128, and 132 preferably begin execution. Preferably, blocks 122, 126, 128 and 130. execute while the head is transporting components to the approximate placement site. Although such blocks are illustrated and described as executing at partially in parallel, it is contemplated that such blocks can execute sequentially. At block 126, the linescan camera passes all n components and collects video data based upon the components. At block 128, the video data is corrected for non-uniformities. Such non-uniformities may be due to changes in sensor scan speed that occur while scanning is performed.

At block 132, X, Y and θ offset adjustments for component $c_p$ are computed. Height information is also computed from review of two assembled images from either method A or method B, as discussed below. Each assembled image is an image of the same portion of the component. The two gray-value pixels (one from each of the assembled images) corresponding to the same location are used in Equation 11 herein to compute the height of the feature on the object. The height information is useful for assessing the location of pins, columns or leads (as appropriate for the component in view), the absence or presence of certain features on the component, such as balls, pins, columns or grids, the distance between leads if the component under test is leaded, or a computation of coplanarity. Once the height of a feature is computed, the coplanarity of that feature with respect to a reference plane may be computed. In a coplanarity computation, a reference plane is selected which is formed by at least three of the features (typically balls, columns or pins) and the deviation of any particular feature from the plane is computed and reported, although in many instances the deviation, computed as an average, standard deviation or the like, is compared to a threshold value to determine whether the component should be discarded or placed.

The computed offset adjustments are used in block 134 to calculate final part placement coordinate endpoints for component $c_p$. After component offset adjustments have been computed, counter P is incremented as indicated in block 136. The machine then checks to determine whether the incremented counter (P) exceeds the number of components (n) picked up in block 120, as indicated at block 138. If the incremented counter exceeds the number of components, then control passes to block 140 and offset calculations cease. However, if the incremented counter does not exceed the number of components, control returns to block 132 and offset adjustments for component $c_p$ are computed. The loop continues with block 132 providing computed offset adjustments to block 134 until offset adjustments have been computed for all n components.

After block 134 receives the placement coordinates, part $c_p$ is placed as indicated at block 137. At block 139, the machine checks to determine whether $c_p$ is the last component. If component $c_p$ is not the last component, control returns to block 124 and the head begins moving to the approximate placement site of the next component. However, if all n components have been placed, then control returns to block 120 and an additional n components are picked up and the method repeats. Preferably, the various steps of placing parts occur while component offset adjustments are calculated.

Figure 8:
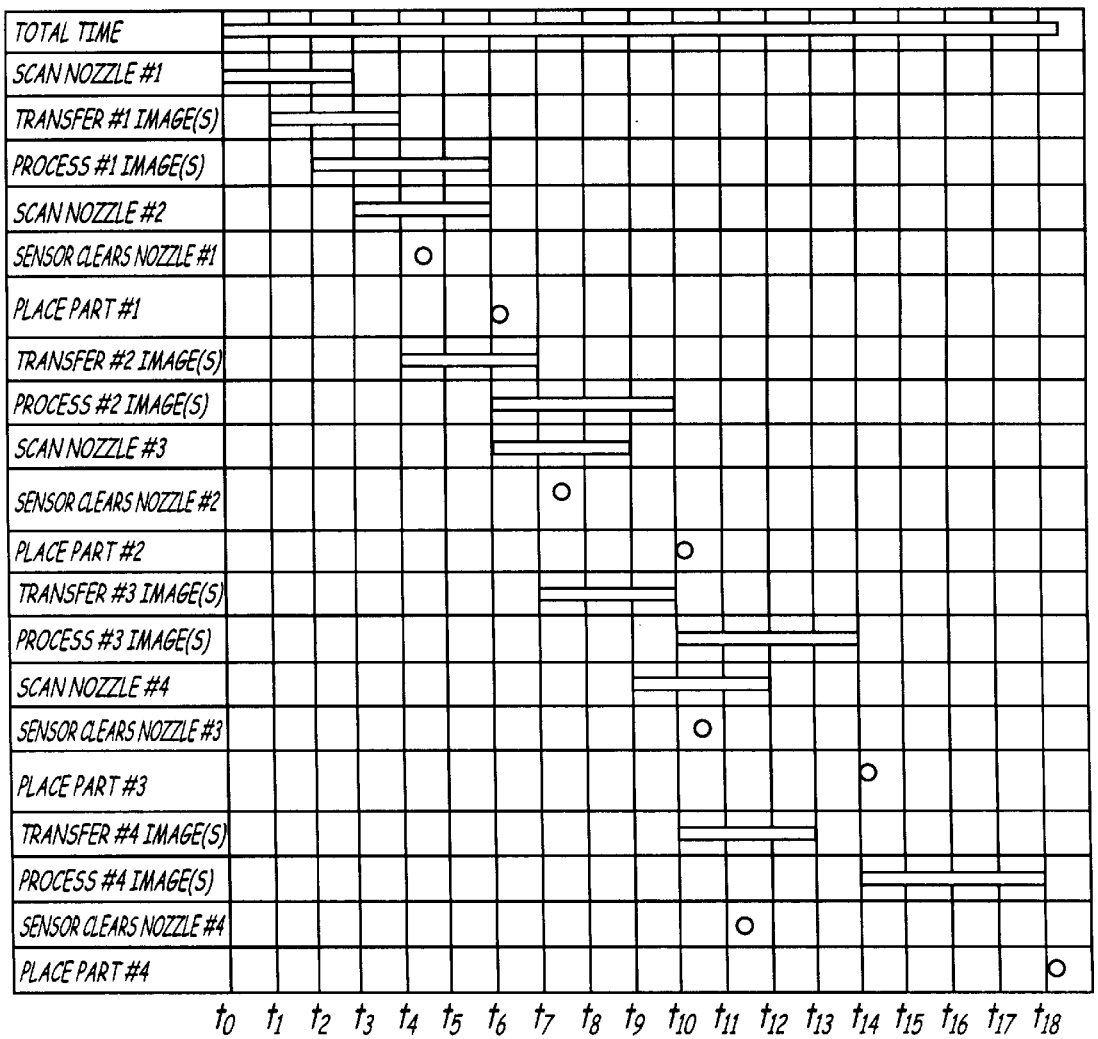
FIG. 8 is a timing diagram of component placement in accordance with an embodiment of the present invention.

FIG. 8 is an example scan timing chart for a pick and place machine having four nozzles in accordance with an embodiment of the present invention. The vertical lines in FIG. 8 indicate specific time intervals. As can be seen, at time $t_0$ scanning of nozzle # 1 begins. For the example illustrated in FIG. 8, nozzle scanning requires three time intervals for completion. Thus, nozzle scanning which begins at time $t_0$ will finish at time $t_3$. As can be seen, while nozzle # 1 is scanned, partial images of the component held by nozzle # 1 begin to be transferred at time $t_1$. At $t_2$, while the nozzle is still being scanned, and while the image is still being transferred, video processing begins. At time $t_3$, scanning of nozzle # 1 has completed and scanning of nozzle # 2 begins even while partial images of the component held by nozzle # 1 are still being transferred and processed. During time $t_4$, the sensor clears nozzle # 1 thereby allowing component # 1 to be placed, which occurs during time $t_6$. As can be seen, component # 1 is placed even while partial images are of component # 2 are transferred and processed. Thus, those skilled in the art will appreciate that the various steps of scanning, transferring, processing, and placing can overlap to some extent, temporally. Although the description of FIG. 8 indicates that the video data windows are processed in sequential order, such notation is provided for clarity since in some instances it is advantageous to process video windows in an order that enhances assembly throughput. Such processing order can be based upon image collection order, placement order, processing time, and travel time between subsequent sites. Thus, it is expressly contemplated that component images can be processed in an order that differs from the order in which the components were picked up by the head.

Figure 9:
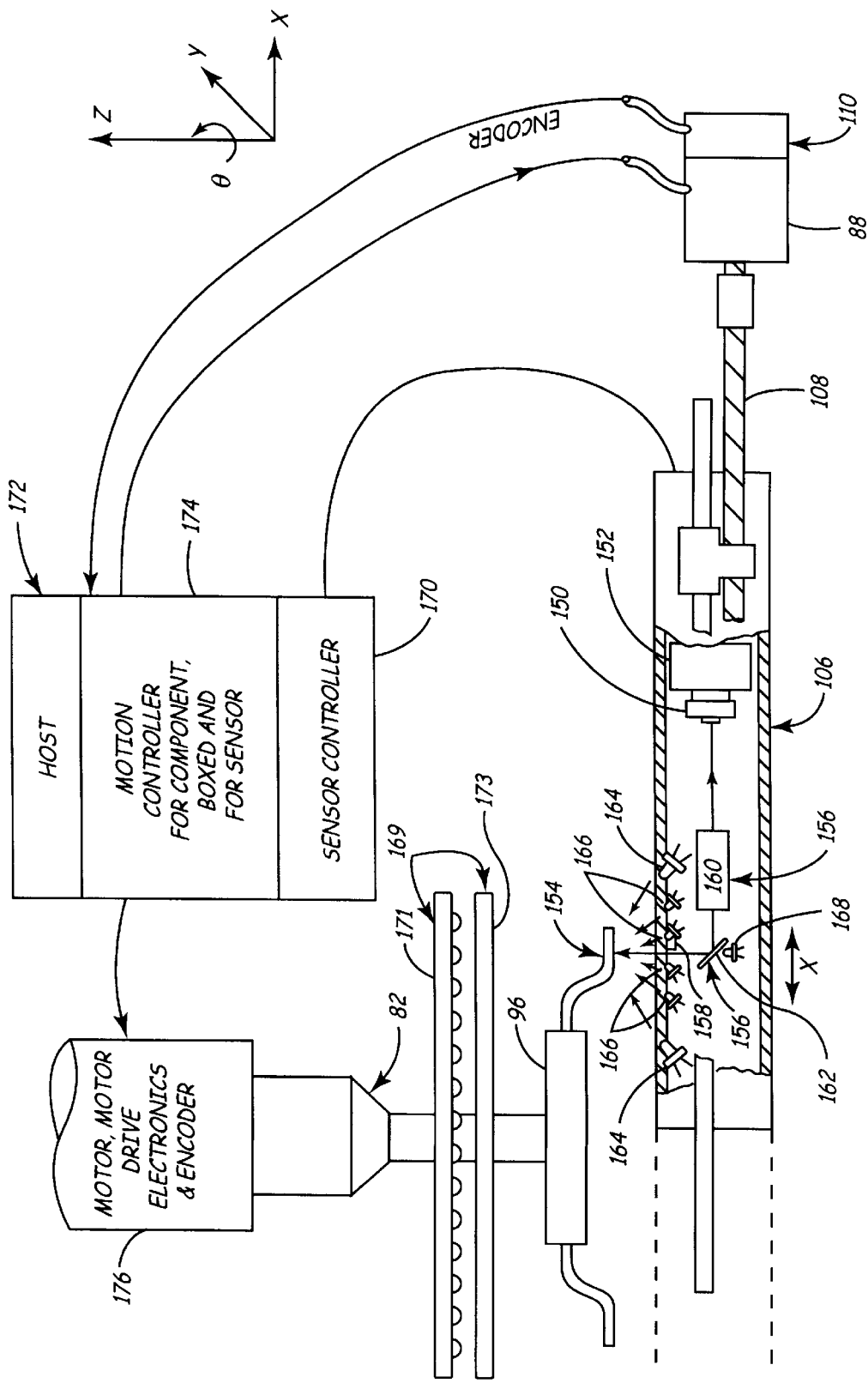
FIG. 9 is a diagrammatic view of a portion of a pick and place machine in accordance with an embodiment of the present invention.

FIG. 9 is a diagrammatic view of sensor 106 as it scans a portion of component 96 held by nozzle 82. (Sensor 106, with its associated electronics, provides only two dimensional information about component 96.) Sensor 106 is operably coupled to motor 88 via ballscrew 108. Motor 88 is operably coupled to encoder 110 which provides an indication of rotary displacement of ballscrew 108 and thus axial displacement of sensor 106 along the X axis. A linear glass scale type encoder could be substituted for encoder 110.

Sensor 106 includes linear detector 150 coupled to sensor electronics 152. Linear detector 150 is preferably a charge coupled device (CCD) comprising a number of photoelements (pixels) arranged in a line. Preferably, the size of each pixel is approximately 14 microns square. Detector 150 is preferably manufactured by Dalsa Inc., of Waterloo Ontario and is model no. IL-CC-2048, although other types of linear detectors may be used in the present invention. Linear detector 150 is optically coupled to a portion of leads 154 through imaging optics 156 and detector window 158. Imaging optics 156 can include lens system 160 and partial mirror 162.

Preferably, sensor 106 also includes one or more illuminators. The embodiment shown in FIG. 9 includes darkfield illuminators 164, diffuse illuminators 166, brightfield illuminator 168, and backlight illuminator 169. As used herein, darkfield illumination is intended to mean illumination which impinges upon the component at a high angle of incidence. Diffuse illumination, as used herein, is intended to mean illumination impinging upon the component at a lesser degree of incidence. Brightfield illumination, as used herein, is intended to mean illumination which impinges upon the component at a substantially zero incidence angle. Thus, brightfield illumination can also be considered specular or through-the-lens illumination. Backlight illumination as the term is used herein, is intended to mean illumination which originates from a position behind the component with respect to the sensor. The combination of these four types of illuminators is helpful to provide enhanced inspection capabilities with the sensors of the present invention, since the illumination types and their various combinations allow features to be identified with greater resolution.

In operation, sensor 106 is moved along the X-axis with respect to component 96. While in motion, sensor 106 acquires individual linear images, or partial images, of portions of component 96. By storing multiple linear images and correlating the individual images with sensor location information provided by encoder 110, an image of component 96 can be constructed.

Illumination emanating from any of darkfield illuminators 164, diffuse illuminators 166 or brightfield illuminator 168 is reflected by a portion of component 96 proximate detector window 158. Additionally, backlight illumination from illuminator 169 can be used, where illumination emanates from source 171 and passes through diffuser 173 to backlight the component. The reflected illumination is redirected by partial mirror 156 through lens system 160, and thereby focused upon linear detector 150. Each individual pixel of linear detector 150 provides a representation of the sum of illumination falling upon the pixel during an integration period.

Lens system 160 can be any suitable optical device capable of focusing an object line upon linear detector 150. Thus, lens system 160 can be a refractive lens system or a diffractive lens system. Such a refractive lens system can preferably include a gradient index (GRIN) lens array, available from NSG America, Inc., of Somerset N.J., or a traditional refractive lens system. A diffractive lens system can include a holographic lens array.

Sensor 106 is coupled to sensor controller 170 of host 172. Sensor controller 170 can receive and store each individual image line in a frame buffer, and provide suitable signals to sensor 106 to control the intensity of any of illuminators 164, 166, 168, and 169 as well as pixel exposure control. Since host 172 is coupled to encoder 110, sensor controller 170 can provide illumination intensity signals to any of the illuminators based upon position of sensor 106 along the X-axis or based upon the scan speed of sensor 106 along the X-axis. Host 172 also includes motion controller 174 that is coupled to motor 88, nozzle motor 176 and a nozzle encoder (not shown). Thus, host 172 acquires an image of component 96 from linear detector 150 as sensor 106 is moved in the X direction relative to component 96. Host 172 is adapted through suitable software, hardware, or both, to compute a current orientation of component 96 in X-axis, Y-axis, and θ directions. Based upon the computed orientation, host 172 causes motion controller 174 to issue suitable motion commands to motors 70, 74 (shown in FIG. 1) and nozzle motor 176 to cause nozzle 82 to deposit component 96 in a desired component position and orientation on the workpiece. Motion controller 174 is adapted to vary scan speed.

Figure 10:
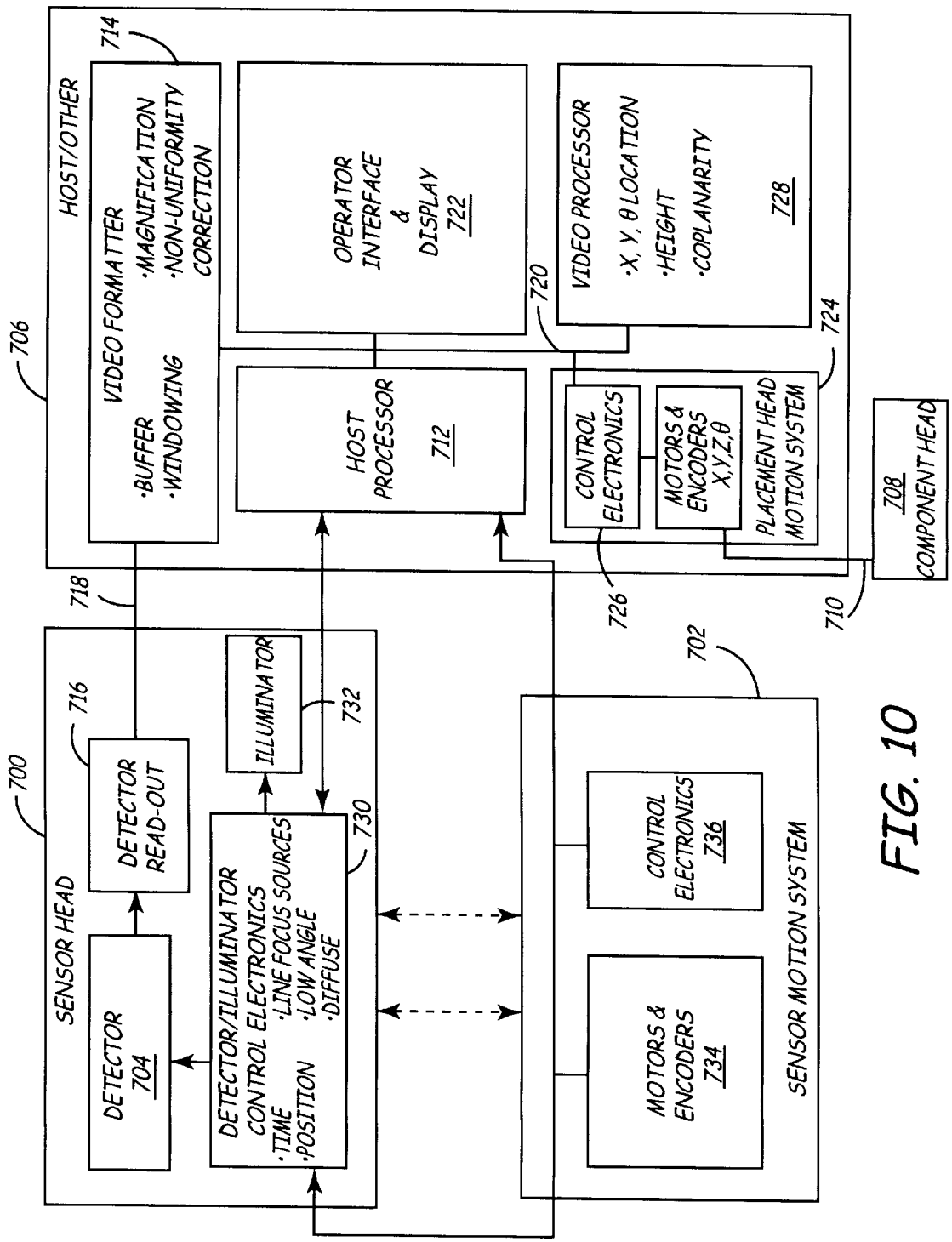
FIG. 10 is a system block diagram of a portion of a pick and place machine in accordance with an embodiment of the present invention.

FIG. 10 is a system block diagram of one embodiment of the height sensing sensor of the present invention and shows sensor head 700 mechanically coupled to a sensor motion system 702, which provides the uniaxial motor drive for head 700. Preferably the system is "on-head", since sensor head 700 moves with component head 708. On a system-level basis, sensor head 700, sensor motion system 702, host 706 and component head 708 form a closed control loop 709 (not shown). In control loop 709, host processor 712 sends a desired placement signal to the component head motor drive 724. System 724 starts to move the component head 708 to the nominal placement location. Then, the combination of sensor head 700 and sensor motor system 702 scan the component using either method A or method B, the detector outputs partial images of the component during the scan, the video formatter 714 assembles a plurality of partial images to form an assembled image of the component, and then video processor 714 processes the assembled image to compute an x, y, and θ orientation of the component, the height of certain features, the coplanarity and other inspection related functions. Video processor 728 sends the orientation information to host processor 712 in pick and place machine 706, which computes a correction signal as a function of a desired orientation and the present orientation. The correction signal is provided to the placement head 708 to properly orient and place the component relative to a reference axis system within host 706. A host processor 712, within pick and place machine 706, sends a desired placement location to component head 708 via bus 720 and bus 710.

Figure 15:
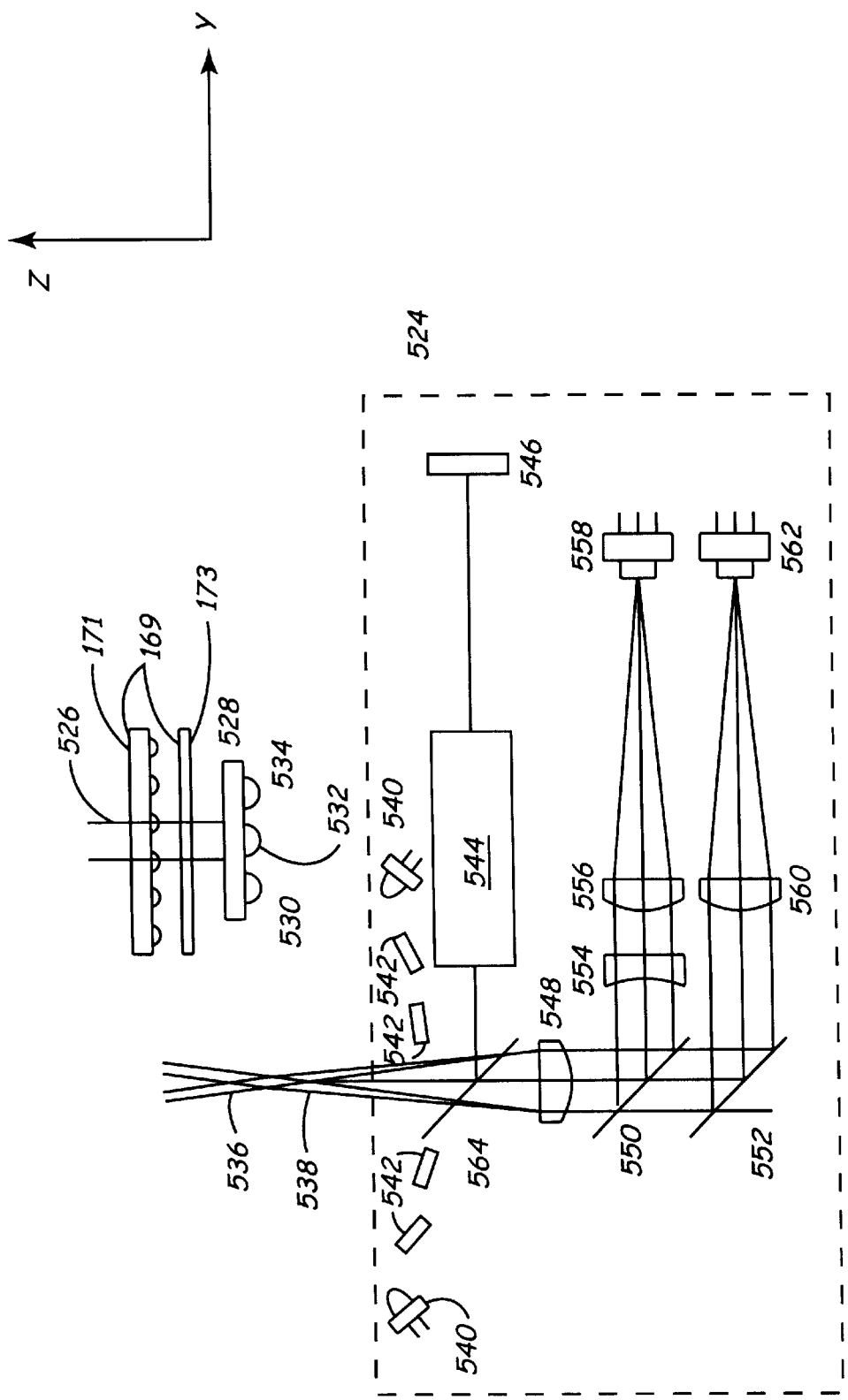
FIG. 15 is a diagrammatic view of a linescan sensor in accordance with an embodiment of the present invention.
Figure 16:
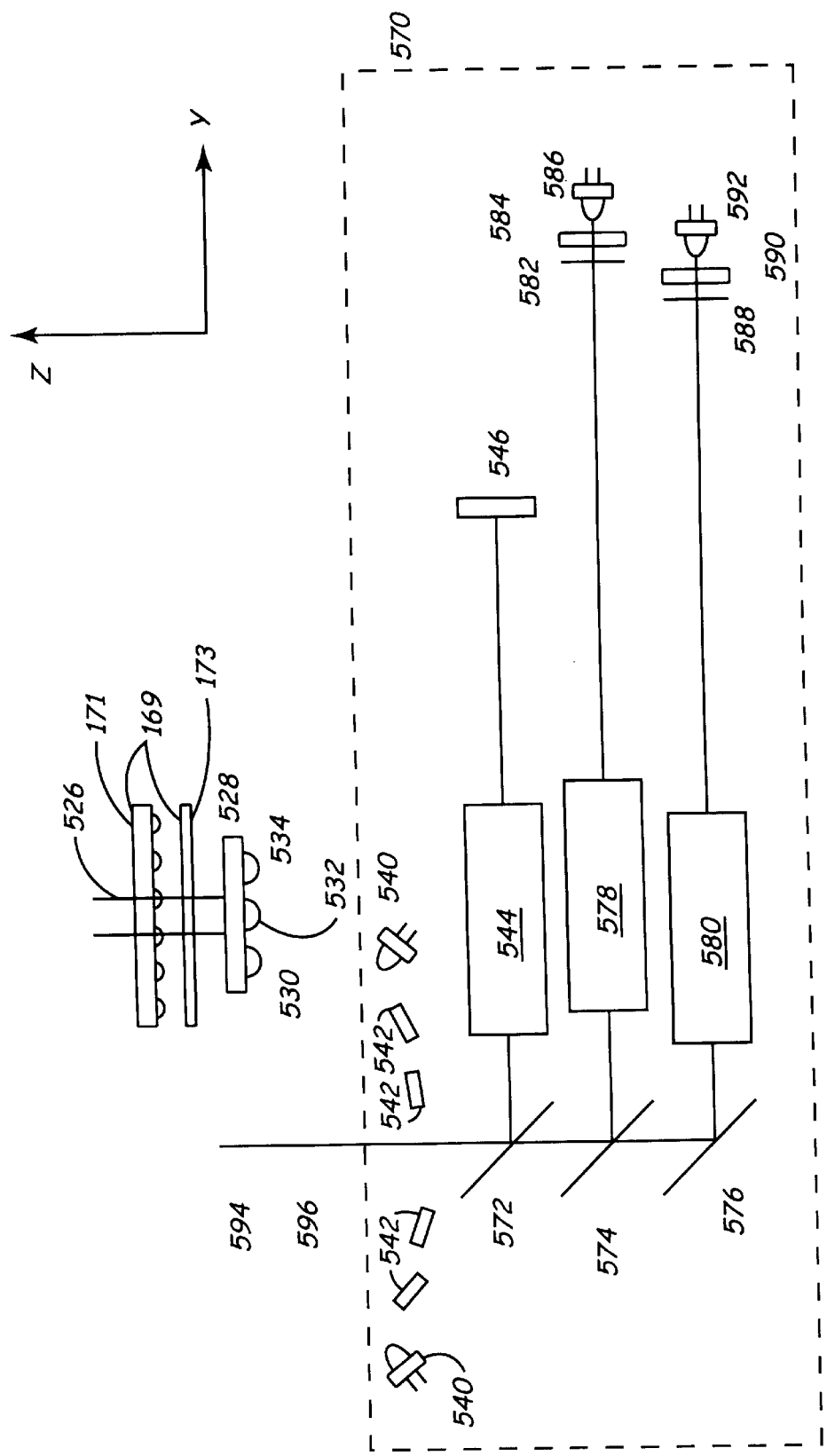
FIG. 16 is a diagrammatic view of another linescan sensor in accordance with an embodiment of the present invention.

There are two methods A and B for practicing the method of the present invention. In preferred method A as illustrated in FIGS. 15 and 16, the two source optical paths (FIG. 15 embodiment has line foci source optical paths 550,558 and 552,562; FIG. 16 embodiment has line foci source optical paths 574,586 and 580,592) are sequentially energized while head 700 scans across the component. At each position of sensor 700, each of the two source optical paths is energized and two partial images are output from block 716. Partial images from each source optical path are interleaved. Then sensor 700 moves to another position and the process begins again. Alternatively, the sensor scans very slowly in order to approximate a "stop". The two assembled images resulting from these interleaved partial images are used in computing height of features in the images. When appropriate for providing contrast of difficult to view features, an additional optical source path is optionally employed in a sensor of method A for the purpose of computing location. In fact, it is preferred to compute location from the additional optical source path. The additional optical source path is formed by energizing any light source at any level of brightness, alone or in combination with any other light source (e.g., brightfield, backlit, diffuse or darkfield illuminators (elements 586/582, 588/592, 558,562,540,542,169 in FIGS. 15 and 16)). When the additional effective optical path is employed with the embodiment of FIGS. 15 and 16, three assembled images will result from one entire scan of a component (two for computing height and one additional one for computing location).

Figure 17:
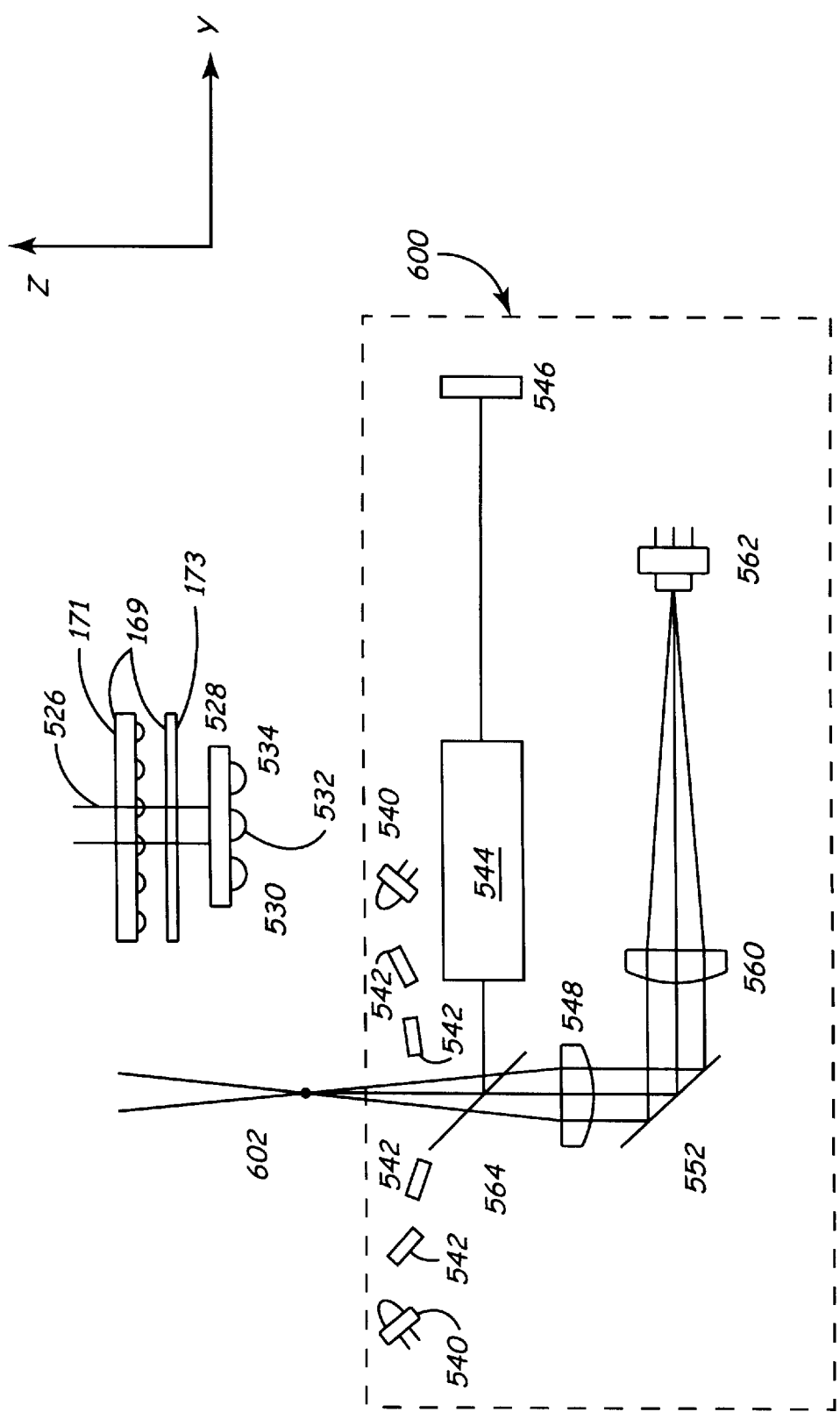
FIG. 17 is a diagrammatic view of yet another linescan sensor in accordance with an embodiment of the present invention.

In method B as illustrated in FIG. 17, there is a single source optical path in the sensor (see elements 562,550,552). Two separate relative movements of sensor 700 relative to the component (a "scan"), each scan at a different component z height, are required to produce the two assembled images for height computation. Output from detector 704 is read out from block 716 during each of the two separate scans in method B. When appropriate for providing contrast of difficult to view features, an additional optical source path is optionally employed in a sensor of method B, for the purpose of computing location. The additional optical source path is preferably used when location of a feature must be computed. The additional optical source path is formed by energizing any light source at any level of brightness, alone or in combination with any other light source (e.g., brightfield, backlit, diffuse or darkfield illuminators (elements 562,540,542,169 in FIG. 17)). When the additional effective optical path is employed with a sensor of method B, three distinct scans are required to collect the three assembled images (two for computing height and one for computing location).

In any of the embodiments of the present invention, a common imaging optical path (see, for example, the imaging optical path defined by 564,544,546) allows a more compact sensor design, increasing speed and throughput.

Video formatter 714 receives outputs from detector readout block 716 in sensor head 700., via bus 718. The function of formatter 714 is preferably carried out in a separate electronic chip than processor 712, but if a minimum of functionality is desired, they may be embodied in the same component. Formatter 714 appropriately assembles the interleaved partial images from method A, and the non-interleaved partial images from method B. Additionally, formatter 714 optionally performs windowing of specific areas of the assembled images, (e.g., corners), performs magnification of specific areas and also may provide non-uniformity correction of the assembled images, where one of the dimensions of the image is disproportionately modified with respect to other dimensions of the assembled image, due to non-uniform spacing of partial images in time or space.

Internal bus 720 connects formatter 714, processor 712, operator interface and display 722, placement head motion control system 724 and video processor 728. In addition to providing a desired placement location for the component to placement head motion system 724, processor 712 also provides various timing signals for proper operation of the pick and place machine 706. For instance, when the pick and place machine has more than one component head, host processor includes suitable collision avoidance functionality to prevent collisions between the various component heads and between the sensor and the nozzles. Operator interface and display 722 allows the operator of the pick and place machine to program specific movements and associated timing of scans, as well as overall operation and diagnostics of the pick and place machine. A video display of the assembled image is also displayed for the operator. Such display is especially useful for providing the windowing, magnification and non-uniformity correction to the operator for programming and diagnosis.

Placement head motion control system 724 includes a set of x, y, z, and θ motors for moving component head 708 in the x, y, z, and θ directions, as well as control electronics 726 for timing such movements and re-formatting the electrical digital signals from host processor 712 into analog signals generally required to drive the x, y, z, and θ motors. A bank of x, y, z, and θ encoders encodes the position of component head 708 and provides these signals to host processor 712.

Video processor 728 can be a microprocessor such as an Intel Pentium® processor. It is preferably included in every embodiment of the present invention, since it provides the basic x, y, and θ location information necessary to allow host processor 712 to properly place the component. Regardless of whether method A or B is practiced, processor 728 receives two assembled images, each image comprises gray-scale pixel values, to compute height of a selected feature using Equation 11 or the like. Once the height is computed in processor 728, computer 728 preferably computes the coplanarity of the features by selecting at least three points to define a plane and then using known methods such as a least squares fit to measure how much the height of the feature deviates from the computed reference plane. The coplanarity of a plurality of points is typically calculated by a maximum deviation between each of the points and the reference plane. Once coplanarity is computed, a measure of the quality of the component can be provided as a function of some golden standard measurement (e.g. threshold, tolerance).

Video data from detector 704 may be sampled in one of two ways, regardless of whether method A, B or the additional two-dimensional optical path is present. The first is to sample the detector data as a function of encoder position from the encoder output from block 734. The second method is to sample detector data as a function of time, from a free-running clock within block 730.

An illuminator 732 (corresponding to illuminators 540, 542 in FIGS. 15–17) physically resides in sensor head 700, and illuminator control electronics 730 also control the operation of illuminator 732 to provide illumination from one or a combination of line focus sources, darkfield illuminators (with individually addressable LED's) for rounded objects, a backlit source and sources for diffuse illumination.

Finally, control electronics 736 within sensor motion system 702 provide timing and position instructions to head 700. A control loop is formed by control electronics 736, which sends out instructions representative of the desired position for head 700 and motor/encoders 734, and head 700. The time constant of this control loop, however, should be less than the time constant of control loop 709, since the line scan sensor should scan faster than the time required to place the component.

Figure 11A:
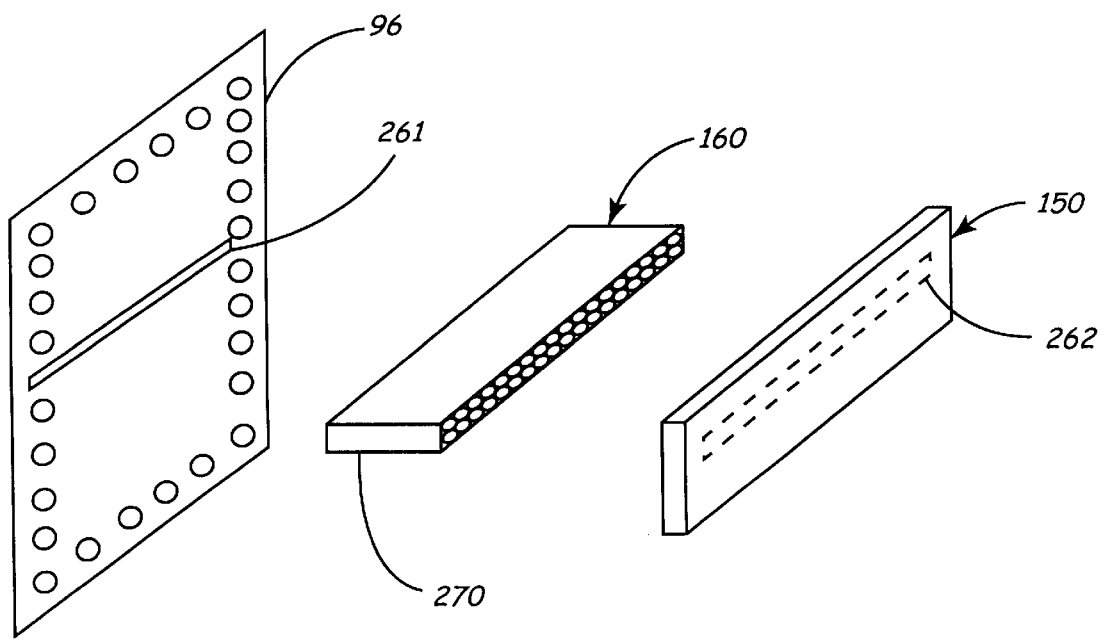

FIGS. 11a and 11b are diagrammatic views of lens system 160 in accordance with an embodiment of the present invention. The system shown in FIGS. 11a and 11b includes a gradient index (GRIN) lens array. A gradient index lens is an optical element within which the refractive index is a smooth, but not constant, function of position and, as a result, the ray paths are curved. This is also known as a graded index lens. The ray curving characteristic of GRIN lens 270 is shown in FIG. 11b where rays emanating from object line 261 enter GRIN lens 270 and begin to curve as indicated. Rays exiting GRIN lens 270 converge and are focused at 262 upon linear detector 150. A GRIN lens array provides a large field of view in a compact space for imaging systems of embodiments of the invention. Although GRIN lens 270 is shown as an example of lens array 160, any suitable optical element capable of focusing object line 261 upon a linear detector can be used. The compact nature of the present invention with the GRIN lens array allows for the pick and place machine of the present invention to have a reduced nozzle "z" stroke. A reduced nozzle "z" stroke is essential to rapid placement of components, since each time a component is placed, the nozzle must be lifted in order to clear the sensor for scanning and then lowered by approximately the same distance to place the component.

Figure 12:
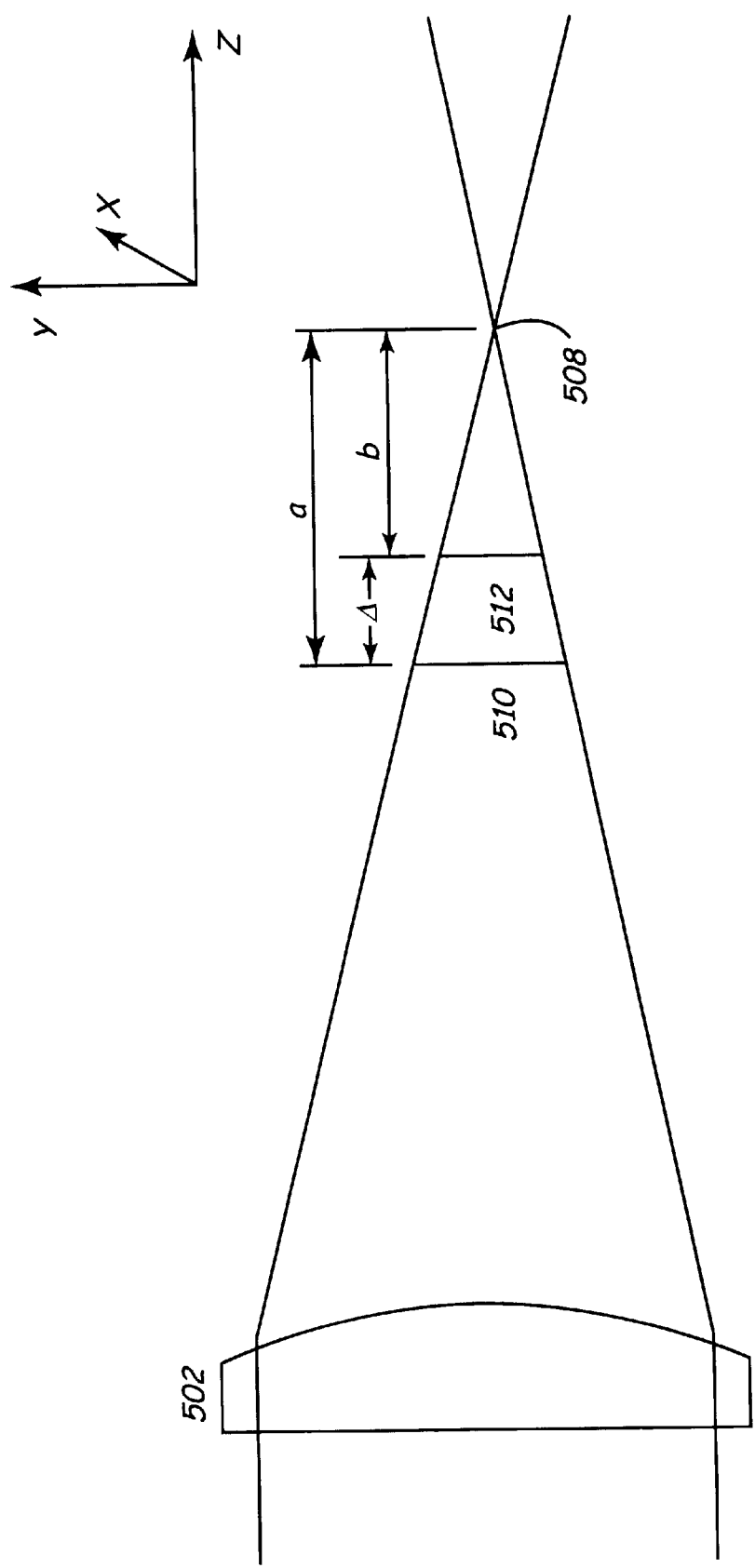
FIG. 12 is a diagrammatic view of light focused by a cylinder lens.
Figure 13:
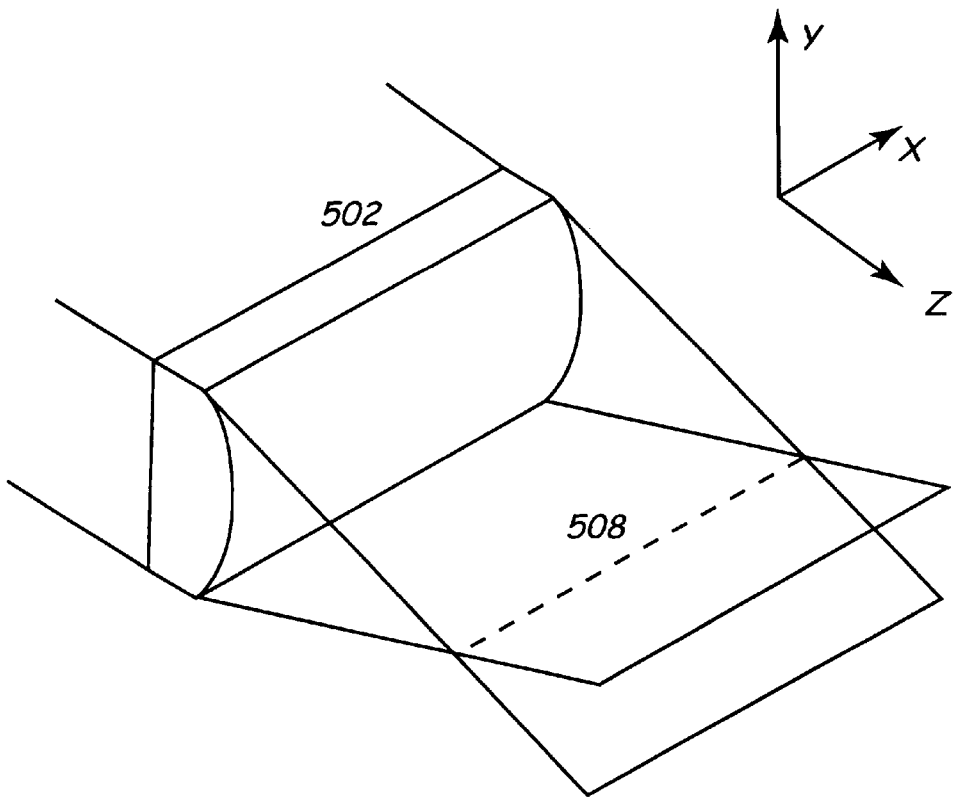
FIG. 13 is a diagrammatic view of the cylinder lens of FIG. 12.

Height computations in the present invention are all premised on the idea that the power density of a light beam focused into a line (a "line foci") decreases as the distance from the line foci increases. FIGS. 12 and 13 show a collimated beam of light that is incident on cylinder lens 502. The light is brought to a line focus 508 by cylinder lens 502. line focus 508 extends in and out of the plane of the age (FIG. 12). Also shown are planes 510 and 512 which extend in and out of the plane of the page. Planes 510 and 512 lie at distances a and b from focal line 508, respectively. The light power density at these planes is inversely proportional to the distance from the plane to the line focus. Consider the amount of light reflected by an object feature if it were placed at plane 512. If the object has reflectivity R then the amount of power reflected by the feature at plane 512 is given by Equation 1:

$$P_{512} = R^*(K/b)$$

where b is the distance from focal line 508 and K is a constant which depends on total beam power and convergence angle. The amount of power reflected by the same object feature placed at plane 510 is given by a similar expression in Equation 2 and 3:

$$P_{510} = R^*(K/a)$$

$$P_{510} = R^*(K/(b+\Delta))$$

To measure the location of an object feature along the Z axis, assume the object feature happens to lie in plane 512 and the power reflected by the object feature, $P_{512}$, is measured. Now the object feature is translated in the Z-direction by the amount $\Delta$ shown in FIG. 12 and $P_{510}$ is measured. Thus, a and b can be computed by knowing $P_{512}$, $P_{512}$ and $\Delta$.

Taking the ratio of $P_{512}$ and $P_{510}$ gives, in Equation 4:

$$P_{512}/P_{510} = [R^*(K/b)]^*(b+\Delta)/(R^*K);$$

and b and a are given in Equation 5 and 6 by:

$$a = b + \Delta$$

$$b = \Delta/((P_{512}/P_{510}) - 1)$$

Hence, the position of the object feature along the Z axis can be computed by knowing $P_{510}$, $P_{512}$, and $\Delta$.

Figure 14:
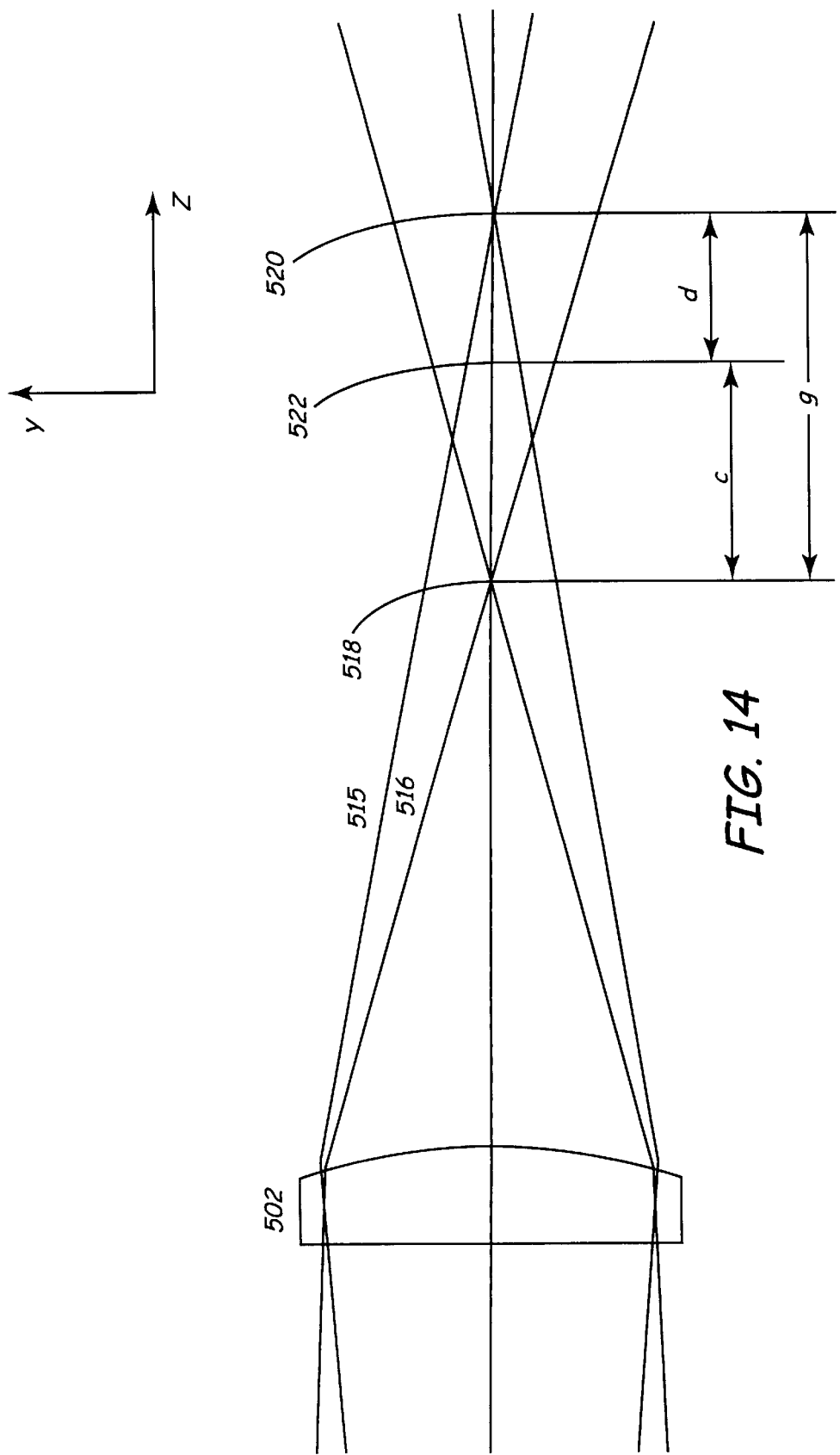
FIG. 14 is a diagrammatic view of a plurality of light beams focused by the cylinder lens of FIG. 12.

FIG. 14 shows an optical geometry where it is possible to measure the location of an object feature along the Z axis without having to translate the object feature a known amount in the Z-direction. FIG. 14 shows two beams of light incident on cylinder lens 502. The incident collimated beam of light is brought to line focus 518 and the slightly diverging beam of light is brought to line focus 520. These two beams of light are labeled 516 and 515, respectively, after being refracted by cylinder lens 502. By measuring the amount of light reflected by an object feature located between line focuses 518 and 520, the feature location may be measured.

Consider the amount of light reflected by the object feature if it were placed at plane 522 in FIG. 14. If the object feature has reflectivity R then the amount of power reflected by the feature due to light beam 516 is given by Equation 7:

$$P_{522,516} = R^*(E/c)$$

and the amount of power reflected by the feature due to beam 515 is given by Equation 8:

$$P_{522,515} = R^*(F/d)$$

From FIG. 14, Equation 9 yields:

$$g = c + d$$

E and F are constants that depend on the total power of each beam and the angle of convergence for each beam. E and F may be calibrated by independent means. The total distance g between line focuses 518 and 520 may also be measured by independent means.

Measuring $P_{522,516}$ and $P_{522,515}$ and taking the ratio of these two measurements gives Equation 10:

$$P_{522,516}/P_{522,515} = (E/c)^*(F/d)$$

Solving for c and d gives the feature height or position along the Z axis. Equation 11 is given by:

$$d = g^*F/((P_{522,516}/P_{522,515})^*E + F)$$

In FIGS. 15–17 a combination of mirrors and beamsplitters are shown for making the line projecting optical paths and the imaging path for the linear detector array coincident. It should be understood that there are many equivalent methods of combining and splitting these optical paths.

One embodiment of the present invention is shown in FIG. 15. Linescan sensor 524 is moved relative to object 528 in the Y-direction. Object 528 is supported by vacuum nozzle 526 and has features 530, 532, and 534. Two focal lines, 536 and 538, are generated in a fashion very similar to that of FIG. 14. The light from point source 562 is collimated by spherical lens 560, is reflected by mirror 552, and is focused to line 538 by cylinder lens 548. The light from point source 558 is collimated by spherical lens 556, is made to diverge slightly by negative cylinder lens 554, is reflected by beam splitter 550, and is focused to line 536 by cylinder lens 548. Point sources 558 and 562 may be, but are not limited to, LED's or laser diodes. Although FIG. 15 shows a specific way of generating line foci 536 and 538, it should be understood that there are many equivalent optical methods for generating these line foci.

In FIG. 15, GRIN lens array 544 images the features of object 528 onto linear detector 546 using beamsplitter 564 to redirect the light. Point sources 558 and 562 can be alternately turned on and off as the sensor scans the features of object 528. Linear detector 546 measures the reflected power due to each source. The height or location of each object features 530, 532, 534 may then be calculated using the methods outlined in the discussion of FIG. 14. Also shown in FIG. 15 are low angle illuminator 540 (also referred to as darkfield illuminators), diffuse illuminator 542 and backlight illuminator 169 (including backlight source 171 and diffuser 173). Using these illuminators in combination with point sources 558 and/or 562 allows linear detector 546 to build up a two-dimensional image of object 528 as linescan sensor 524 is translated in the Y-direction. Moreover, illuminators 540,542 and 169 can be used with the embodiments illustrated in FIGS. 16 and 17.

In order to measure the height of features of object 528, point sources 558 and 562 may be alternately turned on and off as linescan sensor 524 is translated in the Y-direction. This is referred to as interleaving the sources (method A).

Height measurement is useful for tombstone detection. Tombstoning is an undesirable condition in which the component is picked up by a surface other than that opposite the mounting surface. One example of tombstoning is when a chip capacitor is picked up in such a way as to extend partially into the nozzle. Such condition is undesirable because the pick and place machine cannot correct the orientation in order to mount the tombstoned component. Tombstoning may be detected by measuring how far below the nozzle the chip cap extends.

FIG. 16 illustrates another embodiment of the present invention for practicing method A. Light from linear LED array 592 illuminates optical slit 588 through diffuser 590. Linear LED array 592 extends into and out of the plane of the page. Optical slit 588 preferably has a dimension of 5 micrometers in the Z-direction and extends slightly longer than the length of linear detector 546 into and out of the plane of the page. GRIN lens array 580 images optical slit 588 to create focal line 596 using mirror 576. Also, light from linear LED array 586 illuminates optical slit 588 through diffuser 584. GRIN lens array 578 images optical slit 582 to create focal line 594 using beamsplitter 574. Also shown are darkfield illuminator 540 and diffuse illuminator 542. As in the embodiment shown in FIG. 15, there is a common imaging optical path in this embodiment.

FIG. 17 shows another embodiment of the present invention according to method B. Line focus 602 is generated in the same fashion as described with respect to FIG. 16 by using point source 562, spherical collimating lens 560, mirror 552, and cylinder lens 548. To measure the heights of object features, linescan sensor 600 is translated in the Y-direction past object 528 with point source 562 turned on. The output of linear detector 546 is stored in memory (formatter block 714). Object 528 is then displaced a known amount in the Z-direction and linescan sensor 600 is translated past object 58 with point source 562 turned on. The output of linear detector 546 is also stored in memory (formatter block 714) for the second scan. Height of object 528 features is then computed by block 728 using the methods outlined in the discussion of FIG. 14.

Diffuse illuminator 542 and darkfield illuminator 540 can be used in combination with illumination from point source 562 to measure the two-dimensional locations of the features of object 528. Further, the two-dimensional measurements may be interleaved with the measurements used to compute height or the two-dimensional measurements may be made in a separate scan of linescan sensor 600.

Although embodiments of the invention, thus far, have been described with respect to a pick and place machine various embodiments have applicability to other electronic assembly devices such as wire bonders and screen printers.

Figure 18:
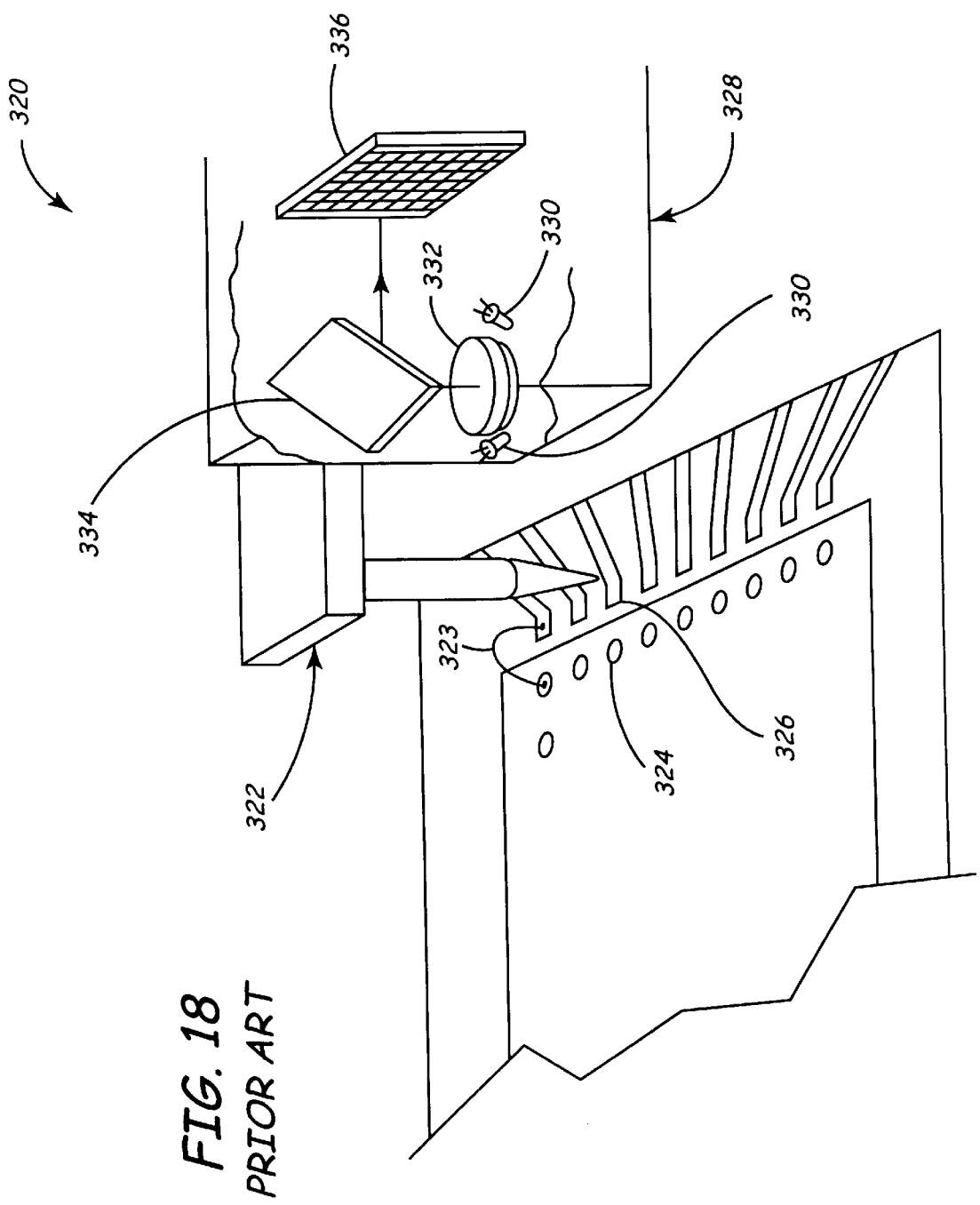
FIG. 18 is a perspective view of a prior art wire bonder.

FIG. 18 is a perspective view of a prior art wire bonder. Bonder 320 includes a bonder head 322 that is adapted to dispense and connect individual wires between die pads 324 and lead pads 326. Bonder 320 uses conventional imaging camera 328 to precisely locate the various pads in order to electrically couple them with wires. Camera 328 includes illuminators 330, lensing system 332, mirror 334 and area detector 336. As is known, illuminators 330 illuminate the pads to be bonded and lens system 332 and mirror 334 cooperate to focus an image of the pads upon area detector 336. Area detector 336 is coupled to additional electronics to process the image to thereby compute die pad and lead pad locations.

Figure 19:
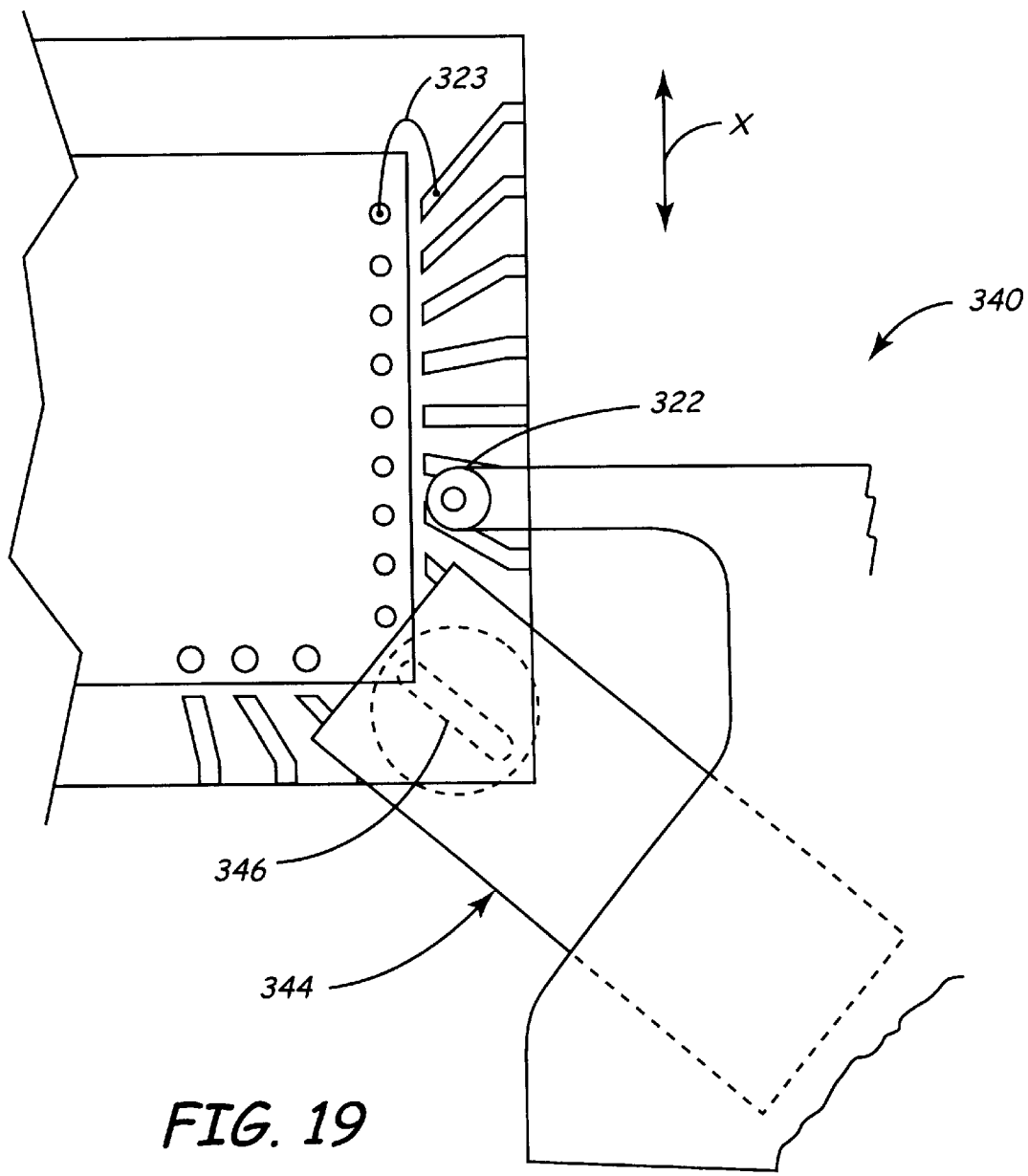
FIG. 19 is a top plan view of a wire bonder in accordance with an embodiment of the present invention.

FIG. 19 is a top plan view of a wire bonder is in accordance with an embodiment of the present invention. Wire bonder 340 includes bonder head 342 and linescan camera 344 in accordance with an embodiment of the present invention. Linescan camera 344 is preferably constructed in accordance with any of the various embodiments described above with respect to pick and place machines, and is able to compute the height of a feature in its field of view. The height of a wire loop 323 can be computed and thresholded with a certain standard, which is helpful in deciding whether to re-work a wire bond or to continue inspecting other wire bonds. The ability to compute height in the present invention can proactively indicate whether a wire bond will short to its packaging in certain applications. Although detector window 346 of line scan detector 344 is disposed at an angle (of approximately 45°) relative to the scan direction X, other embodiments are possible where the detector window is positioned at any location. Orienting the detector window at an angle relative to the scan direction, however, facilitates scanning all four sides of the die.

Although the present invention has been described with reference to preferred embodiments, workers skilled in the art will recognize that changes may be made in form and detail without departing from the spirit and scope of the invention. For example, the present invention is not limited to the embodiments of linescan sensors and associated electronics shown herein and may be practiced with other linescan cameras.

What is claimed is:

1. A method for providing a height of a feature on a reflective object, the object situated along an optical axis, the method comprising:

projecting light into a line focus, the line focus perpendicular to the optical axis;

causing the line focus and the object to relatively move with respect to each other along the optical axis;

collecting a first assembled image of the object before the relative movement and substantially sequentially collecting a second assembled image of the object after the relative movement of the line focus and the object, each step of collecting comprising the steps of:

1) capturing a plurality of partial images of the object from a linear detector, as the linear detector and the object move relative to each other in a scan direction;

2) assembling the plurality of partial images into an assembled image of the object; and computing the height of at least one feature as a function of the two assembled images.

2. The method of claim 1 further comprising the step of computing a reference plane comprised of at least three heights of features on the object, and providing an output representative of a coplanarity of an additional feature as a function of the reference plane and the height of the additional feature.

3. The method of claim 1 where the relative movement of the line focus and the object results from projecting light into a second line focus.

4. The method of claim 1 further comprising the steps of:
a) collecting a plurality of third partial images from the detector while a third optical path is energized and while the detector and the object move relative to one another, the third optical path comprised of light sources;
b) assembling the third partial images into a third assembled image, where the step of computing further comprises the step of computing a location of a feature from the third assembled image.

5. The method of claim 3 where the one of the two assembled images was collected when the light was projected in the line focus, and the other assembled image was collected when the light was projected into the second line focus, where the step of computing the height is accomplished as a function of the intensities of the two assembled images.

6. The method of claim 3 where a first optical path provides light for the line focus and the second optical path provides light for the second line focus.

7. The method of claim 6 where the first optical path converts a point source to a line focus, and the second optical path converts a point source to the second line focus, the first and second optical paths coincident between the line focus and the second line focus.

8. The method of claim 6 where the first optical path images a slit to the line focus.

9. The method of claim 6 where the second optical path images a slit to the second line focus.

10. The method of claim 9 where the first and the second optical path each include a gradient index lens array.

11. The method of claim 6 where the linear detector provides a plurality of third partial images of the object to electronics while the linear detector and the linear detector move relative to each other in a scan direction, the electronics assembling the plurality of third partial images into a third assembled image, where the location of at least one feature on the object is computed as a function of the third assembled image.

12. The method of claim 1 where the relative movement of the line focus and the object results from moving the object between a first and a second location along the optical axis.

13. The method of claim 12 where the step of computing the height is accomplished as a function of intensities of the two assembled images.

14. The method of claim 1, where the relative movement of the line focus and the object consists of moving the object.

15. The method of claim 1, where the relative movement of the line focus and the object consists of moving the line focus.

16. The method of claim 1, where the relative movement of the line focus and the object includes moving the line focus in a direction substantially parallel to a nozzle axis.

17. The method of claim 1, where the first and second images are interleaved.

18. The method of claim 1, and further comprising calculating object orientation based at least in part upon one of the first and second assembled images.

19. The method of claim 18, wherein the first and second assembled images are collected through a gradient index lens array.

20. The method of claim 1, where projecting the light includes causing a laser source to project light into the line focus.

21. The method of claim 1, where projecting the light includes projecting light of a type selected from the group consisting of darkfield and diffuse.

22. The method of claim 1, where projecting the light includes energizing at least one light emitting diode.

23. The method of claim 1, where the step of projecting the light is performed through a gradient index lens array.

24. The method of claim 23, where the step of projecting the light is additionally performed through a slit.

25. The method of claim 1, where computing height of the at least one feature is based at least in part upon an encoder feedback signal indicative of detector position relative to the object.

26. The method of claim 1, where the object is of a type selected from the group consisting of ball grid array, micro ball grid array, flip-chip, plastic leaded chip carrier, and quad flat pack.

27. A method for providing a height of a feature n a reflective object, the object situated along an optical axis, the method comprising:
a) energizing a first optical path directing light into a first line focus, the first line focus perpendicular to the optical axis and collecting a first partial image of the object from a detector;
b) turning the first optical path off;
c) energizing a second optical path directing light into a second line focus, the second line focus perpendicular to the optical axis and collecting a second partial image of the object from the detector;
d) moving the object and the detector relative to each other, and repeating the steps of a) through c) until a desired number of first and second partial images has been acquired, and
e) assembling the plurality of partial images into a pair of assembled images of the object, one assembled image comprised of first partial images and the other assembled image comprised of second partial images; and
f) computing the height of at least one feature as a function of the two assembled images.

28. The method of claim 27 where a third optical path comprising non-specular light sources is energized before the step of moving the object so as to acquire a third partial image from the detector, where the step of assembling includes the step of assembling the third partial images into a third assembled image and where the step of computing includes the step of computing the location of a feature as a function of the third assembled image.

29. The method of claim 28 where the first and the second optical paths are energized during the step of acquiring third partial images from the detector.

30. A pick and place machine adapted to place a component, the machine comprising:
a host processor providing a desired location to place the component;
a component placement head for releasably holding the component;

a lens system for viewing the component, the system having an optical axis passing therethrough;

a detector adapted to view the component and to provide a partial image thereof;

a first optical path for projecting light into a first line focus;

a second optical path for projecting light into a second line focus;

a sensor motion control system adapted to cause a relative movement between the detector and the component;

video processing electronics coupled to the detector, so that after the relative movement is finished, a plurality of first partial images from the detector is representative of a first assembled image of the component and a plurality of second partial images from the detector is representative of a second assembled image of the component, where the video processing circuitry provides feature height information as a function of the first and the second assembled images;

where the host processor instructs the component placement head to move based at least in part upon the feature height information; and where the video processing electronics collects a plurality of first partial images until the relative movement between the component and the detector is finished, then the sensor motion control system resets and the video processing electronics collects a plurality of second partial images until the relative movement is finished, at which time the video processing electronics provides feature height information as a function of the two assembled images.

31. A wire bonder adapted to bond wire between a die pad and a lead frame, the bonder comprising:

a host processor providing a desired location to bond wire;

a wire bonder head adapted to dispense and electrically connect wire;

a lens system for viewing at least a portion of one of the wire, the die pad, and the lead frame, the system having an optical axis passing therethrough;

a detector adapted to view the portion, and to provide a partial image thereof;

a first optical path for projecting light into a first line focus;

a second optical path for projecting light into a second line focus;

a sensor motion control system adapted to cause a relative movement between the detector and the portion;

video processing electronics coupled to the detector, so that after the relative movement is finished, a plurality of first partial images from the detector is representative of a first assembled image of the portion and a plurality of second partial images from the detector is representative of a second assembled image of the portion, where the video processing circuitry provides at least feature height information of the portion as a function of the first and the second assembled images;

where the host processor instructs the bonder head to move based at least in part upon the feature height information; and wherein the portion is representative of the wire, and the feature height information is representative of wire loop height.

32. An optical system for computing a height of a feature in a vertical direction, the system comprising:

a sensor housing;

a first and second optical path for providing a first and a second line foci spaced in the vertical direction, the first and second paths adapted to be energized sequentially;.

a linear detector adapted to view the feature and provide a plurality of partial images of the feature;

electronics for processing two sets of the plurality of partial images to form two respective assembled images, the electronics providing the height of the feature as a function of a ratio of an intensity corresponding to the feature between both assembled images; and wherein the machine is selected from the group of machines called pick and place machines, screen printers and wire bonders.

33. A method for providing a height of a feature on a reflective object, the object situated along an optical axis, the method comprising:

projecting light into a line focus, the line focus perpendicular to the optical axis;

causing the line focus and the object to relatively move with respect to each other along the optical axis;

collecting a first assembled image of the object before the relative movement and substantially simultaneously collecting a second assembled image of the object after the relative movement of the line focus and the object, each step of collecting comprising the steps of:

1) capturing a plurality of partial images of the object from a linear detector, as the linear detector and the object move relative to each other in a scan direction; and 2) assembling the plurality of partial images into an assembled image of the object; and computing the height of at least one feature as a function of the two assembled images.

* * * * *